United States Patent
Blease et al.

(10) Patent No.: US 11,240,916 B2
(45) Date of Patent: Feb. 1, 2022

(54) ELECTRONIC DEVICE, METHOD AND APPARATUS FOR PRODUCING AN ELECTRONIC DEVICE, AND COMPOSITION THEREFOR

(71) Applicant: Cryovac, LLC, Charlotte, NC (US)

(72) Inventors: James W. Blease, Avon, NY (US); Theodore F. Cyman, Jr., Grand Island, NY (US)

(73) Assignee: CRYOVAC, LLC, Charlotte, NC (US)

( * ) Notice: Subject to any disclaimer, the term of this patent is extended or adjusted under 35 U.S.C. 154(b) by 0 days.

(21) Appl. No.: 16/617,959

(22) PCT Filed: May 31, 2018

(86) PCT No.: PCT/US2018/035403
§ 371 (c)(1),
(2) Date: Nov. 27, 2019

(87) PCT Pub. No.: WO2018/222877
PCT Pub. Date: Dec. 6, 2018

(65) Prior Publication Data
US 2020/0107450 A1 Apr. 2, 2020

Related U.S. Application Data

(60) Provisional application No. 62/513,040, filed on May 31, 2017.

(51) Int. Cl.
*H05K 3/12* (2006.01)
*B41F 5/24* (2006.01)
(Continued)

(52) U.S. Cl.
CPC ............ *H05K 3/1208* (2013.01); *B41F 5/24* (2013.01); *C09J 5/00* (2013.01); *C09J 9/02* (2013.01);
(Continued)

(58) Field of Classification Search
CPC .. H05K 3/1208; B41F 5/24; C09J 5/00; C09J 9/02; C09J 109/06
(Continued)

(56) References Cited

U.S. PATENT DOCUMENTS

| | | |
|---|---|---|
| 4,012,552 A | 3/1977 | Watts |
| 4,368,281 A | 1/1983 | Brummett et al. |

(Continued)

FOREIGN PATENT DOCUMENTS

| | | |
|---|---|---|
| DE | 10 2013 007 702 A1 | 11/2014 |
| EP | 0 414 362 A2 | 2/1991 |

(Continued)

OTHER PUBLICATIONS

International Search Report and Written Opinion dated Aug. 23, 2018, for International Application No. PCT/US2018/035403, Applicant, R.R. Donnelley & Sons Company (15 pages).

(Continued)

*Primary Examiner* — Tremesha S Willis
(74) *Attorney, Agent, or Firm* — McCracken & Gillen LLC

(57) ABSTRACT

An electronic device, a method and apparatus for producing an electronic device, and a composition therefor are disclosed. An adhesive material is applied in a first pattern on a surface of a receiver substrate. A carrier having a metal foil disposed thereon is brought into contact with the first substrate such that a portion of the metal foil contacts the adhesive material. The adhesive material includes a first polymer, a second polymer, and a conductive carbon black dispersion, and is activated using at least one of mechanical pressure and heat while the portion of the metal foil is in contact with the adhesive material. The first substrate and the second substrate are separated, whereby the portion of the metal foil is transferred to the first substrate. The (Continued)

adhesive is electrically conductive to maximize the possibility of maintaining electrical connectivity even when there is a break in the metal foil.

14 Claims, 11 Drawing Sheets

(51) Int. Cl.
| | |
|---|---|
| C09J 5/00 | (2006.01) |
| C09J 9/02 | (2006.01) |
| C09J 109/06 | (2006.01) |
| C09J 123/08 | (2006.01) |
| C09J 133/06 | (2006.01) |
| C09J 175/04 | (2006.01) |
| H01B 1/24 | (2006.01) |
| H05K 1/09 | (2006.01) |

(52) U.S. Cl.
CPC ....... *C09J 109/06* (2013.01); *C09J 123/0869* (2013.01); *C09J 133/062* (2013.01); *C09J 175/04* (2013.01); *H01B 1/24* (2013.01); *H05K 1/095* (2013.01); *H05K 3/1275* (2013.01); *C09J 2409/00* (2013.01); *C09J 2423/04* (2013.01); *C09J 2433/00* (2013.01); *C09J 2475/00* (2013.01); *H05K 2201/0355* (2013.01); *H05K 2201/0379* (2013.01); *H05K 2201/0391* (2013.01); *H05K 2203/0522* (2013.01); *H05K 2203/1545* (2013.01)

(58) Field of Classification Search
USPC ........................................................ 174/257
See application file for complete search history.

(56) References Cited

U.S. PATENT DOCUMENTS

| | | | |
|---|---|---|---|
| 4,515,653 A | 5/1985 | Furubayashi et al. | |
| 5,520,763 A | 5/1996 | Johnstone | |
| 5,581,065 A | 12/1996 | Nishikawa et al. | |
| 5,802,015 A | 9/1998 | Rothschild et al. | |
| 6,019,865 A | 2/2000 | Palmer et al. | |
| 6,043,745 A | 3/2000 | Lake | |
| 6,223,799 B1 | 5/2001 | Johnstone | |
| 6,420,096 B1 | 7/2002 | Löbl et al. | |
| 6,421,013 B1 | 7/2002 | Chung | |
| 6,544,864 B2 | 4/2003 | Reeder et al. | |
| 6,853,087 B2 | 2/2005 | Neuhaus et al. | |
| 6,886,745 B2 | 5/2005 | Berrube et al. | |
| 6,888,509 B2 | 5/2005 | Atherton | |
| 6,924,781 B1 | 8/2005 | Gelbman | |
| 7,042,357 B2 | 5/2006 | Girvin et al. | |
| 7,057,495 B2 | 6/2006 | Debord et al. | |
| 7,168,626 B2 | 1/2007 | Lerch et al. | |
| 7,174,277 B2 | 2/2007 | Vock et al. | |
| 7,204,425 B2 | 4/2007 | Mosher, Jr. et al. | |
| 7,248,147 B2 | 7/2007 | Debord et al. | |
| 7,283,054 B2 | 10/2007 | Girvin et al. | |
| 7,295,115 B2 | 11/2007 | Aljadeff et al. | |
| 7,316,358 B2 | 1/2008 | Kotik et al. | |
| 7,323,360 B2 | 1/2008 | Gonzalez et al. | |
| 7,377,447 B2 | 5/2008 | Oberle | |
| 7,417,541 B2 | 8/2008 | Lerch et al. | |
| 7,586,412 B2 | 9/2009 | Takatama | |
| 7,627,451 B2 | 12/2009 | Vock et al. | |
| 7,639,135 B2 | 12/2009 | Arms et al. | |
| 7,737,839 B1 | 6/2010 | Jones | |
| 7,802,222 B2 | 9/2010 | Arsintescu | |
| 7,856,339 B2 | 12/2010 | Vock et al. | |
| 7,895,739 B2 | 3/2011 | Niklas et al. | |
| 7,945,320 B2 | 5/2011 | Durand | |
| 7,993,055 B2 | 8/2011 | Nurse et al. | |
| 8,126,675 B2 | 2/2012 | Vock et al. | |
| 8,203,446 B2 | 6/2012 | Tsubota et al. | |
| 8,219,466 B2 | 7/2012 | Gui et al. | |
| 8,280,682 B2 | 10/2012 | Vock et al. | |
| 8,317,084 B2 | 11/2012 | Bagai | |
| 8,354,927 B2 | 1/2013 | Breed | |
| 8,428,904 B2 | 4/2013 | Vock et al. | |
| 8,590,799 B2 | 11/2013 | Liu | |
| 8,618,914 B2 | 12/2013 | Bachman et al. | |
| 8,640,259 B2 | 1/2014 | Jung et al. | |
| 8,747,775 B2 | 6/2014 | Sandvick | |
| 8,762,212 B2 | 6/2014 | Falls et al. | |
| 8,870,083 B2 | 10/2014 | Myers et al. | |
| 8,914,090 B2 | 12/2014 | Jain et al. | |
| 9,030,724 B2 | 5/2015 | Agrawal et al. | |
| 9,047,437 B2 | 6/2015 | Chen et al. | |
| 9,077,183 B2 | 7/2015 | Thomas et al. | |
| 9,087,318 B1 | 7/2015 | Cordes et al. | |
| 9,495,498 B2 | 11/2016 | Bartley et al. | |
| 9,514,432 B2 | 12/2016 | Cyman, Jr. et al. | |
| 9,691,393 B2 | 6/2017 | Cyman, Jr. et al. | |
| 9,785,881 B2 | 10/2017 | Cyman, Jr. et al. | |
| 10,026,056 B2 | 7/2018 | Cyman, Jr. et al. | |
| 10,089,594 B2 | 10/2018 | Gray | |
| 2004/0066296 A1 | 4/2004 | Atherton | |
| 2007/0215376 A1 | 9/2007 | Walther | |
| 2010/0210745 A1* | 8/2010 | McDaniel | C09D 5/1668 521/55 |
| 2011/0131854 A1 | 6/2011 | Waltersdorf | |
| 2012/0071742 A1 | 3/2012 | Medina et al. | |
| 2012/0162945 A1 | 6/2012 | Schreiner | |
| 2013/0279194 A1* | 10/2013 | Hodrinsky | G02B 6/0065 362/612 |
| 2014/0196847 A1 | 7/2014 | Bergherm | |
| 2014/0216644 A1* | 8/2014 | Keite-Telgenbuscher | C09J 7/10 156/272.4 |
| 2016/0012943 A1* | 1/2016 | Rachi | H01R 4/185 174/72 A |
| 2016/0050762 A1* | 2/2016 | Cyman, Jr. | G06K 19/077 156/233 |
| 2016/0055453 A1 | 2/2016 | Cyman, Jr. et al. | |
| 2016/0148899 A1 | 5/2016 | Ichimura | |
| 2016/0249840 A1 | 9/2016 | Pesantez et al. | |
| 2017/0053235 A1 | 2/2017 | Cyman, Jr. et al. | |
| 2017/0076642 A1 | 3/2017 | Cyman, Jr. et al. | |
| 2017/0138922 A1 | 5/2017 | Potyrailo et al. | |
| 2017/0191953 A1 | 7/2017 | Rigas | |
| 2017/0192374 A1* | 7/2017 | Landa | G03G 15/162 |
| 2017/0203558 A1 | 7/2017 | Cyman, Jr. et al. | |
| 2017/0229000 A1 | 8/2017 | Law | |
| 2017/0354372 A1 | 12/2017 | Varadan et al. | |
| 2019/0373716 A1* | 12/2019 | Haruna | H05K 1/0218 |

FOREIGN PATENT DOCUMENTS

| | | |
|---|---|---|
| EP | 1 879 435 A2 | 1/2008 |
| FR | 2 997 218 A1 | 4/2014 |
| JP | 2003-277653 | 10/2003 |
| JP | 2011-151259 | 8/2011 |
| WO | WO 00/73082 A1 | 12/2000 |
| WO | WO 03/006736 A1 | 1/2003 |
| WO | WO 2008/055867 A1 | 5/2008 |
| WO | WO 2014/067578 A1 | 5/2014 |
| WO | WO 2015/004830 A1 | 1/2015 |

OTHER PUBLICATIONS

Duck, A., Dispensing SMD Adhesives: Rotary Pump Technology vs. Stencil Printing Technology, Electronic Packaging and Production, Aug. 1, 1996, pp. 41-44, vol. 36, No. 9, Cahners Publishing Co, Newton Massachusetts, U.S. (4 pages).

Supplementary European Search Report and Search Opinion for European Application No. EP 18 81 0234, dated Jan. 27, 2021 (8 pages).

* cited by examiner

US 11,240,916 B2

ELECTRONIC DEVICE, METHOD AND APPARATUS FOR PRODUCING AN ELECTRONIC DEVICE, AND COMPOSITION THEREFOR

CROSS REFERENCE TO RELATED APPLICATIONS

The present application is a national phase application of International Patent Application No. PCT/US2018/035403, entitled "Electronic Device, Method and Apparatus for Producing an Electronic Device, and Composition Therefor, filed on May 31, 2018, which claims the benefit of U.S. Provisional Patent Application No. 62/513,040, filed May 31, 2017, entitled "Electronic Device, Method and Apparatus for Producing an Electronic Device, and Composition Therefor." The entire contents of these applications are incorporated herein by reference.

FIELD OF THE DISCLOSURE

The present subject matter relates to electronic devices and methods and apparatus for producing electronic devices by printing metals and other conductive materials, and more particularly, to electronic devices produced by methods and apparatus that use foil transfer printing.

BACKGROUND

Metals may be applied to products for both decorative and functional reasons. A metal may be applied to portions of a product, such as a container, a certificate, or a publication to distinguish such portions from other portions that are free of the metal or are printed with non-metallic ink. Metals may also be applied to a substrate to form electrically conductive areas on the substrate such as, for example, traces of an electronic circuit or an imprinted antenna, for example, an antenna for use with a radio-frequency identification transponder.

An image in metal may be formed on a substrate by printing such image with a metallic ink using, for example, gravure, lithographic, and inkjet printing systems. In such printing systems, liquid metallic ink may be applied to the substrate in a manner similar to how non-metallic ink may be applied thereto.

Alternately, a metal image may be formed on the substrate, by coating the substrate indiscriminately with a metal or applying a metal foil to the substrate. Thereafter, portions of the metal or metal foil that are not part of or otherwise define the image (or, in the case of another image (e.g., a reverse image), portions that are part of the image or otherwise define the image) may be selectively removed from the substrate by, for example, etching or ablation.

U.S. Pat. No. 5,520,763 discloses transferring foil to a substrate by first selectively applying to the substrate toner particles that have a thermoplastic component. The foil is supplied on a foil strip that includes an adhesive layer facing outwardly, a foil layer, and a release coating on a backing. The foil strip with the adhesive layer and the substrate are introduced into a nip between an impression cylinder and a transfer cylinder. Heat and pressure are applied at the nip to transfer the adhesive and foil from the foil strip to the toner on the substrate to produce a foil printed substrate. The toner on the substrate may be heated before the substrate enters the nip to increase the tackiness thereof.

SUMMARY

According to a first aspect, a method of producing an electronic device includes the steps of applying an adhesive material in a first pattern on a surface of a first substrate, wherein the adhesive material is electrically conductive and applying a metal on top of the adhesive material to secure the metal to the first substrate. Applying the metal comprises bringing a second substrate having a metal foil disposed thereon proximate to the first substrate such that a portion of the metal foil contacts the adhesive material, activating the adhesive material using at least one of mechanical pressure and heat while the portion of the metal foil is in contact with the adhesive material, and separating the first substrate and the second substrate, whereby the portion of the metal foil is transferred from the second substrate to the first substrate. The applied heat of the activating step heats the adhesive material from approximately 60 degrees Celsius to approximately 160 degrees Celsius and the applied pressure of the activating step is from about 10 psi to about 25 psi. The metal comprises a conductive trace of an electronic circuit and the viscosity of the adhesive material is between about 1,000 and about 3,000 mPa-s.

A second aspect, according to the method of the first aspect, wherein the step of applying the metal comprises: bringing a second substrate having a metal foil disposed thereon into contact with the first substrate such that a portion of the metal foil contacts the adhesive material; activating the adhesive material using at least one of mechanical pressure and heat while the portion of the metal foil is in contact with the adhesive material; and separating the first substrate and the second substrate, whereby the portion of the metal foil is transferred from the second substrate to the first substrate.

A third aspect, according to the method of any of first and second aspects, wherein the adhesive material comprises a conductive carbon black and two or more polymers, wherein the conductive carbon black is a non-ionic conductive carbon black dispersion, and wherein the metal is copper.

A fourth aspect, according to the method of any of the first through third aspects, wherein the first polymer is an ethylene acrylic acid copolymer having a molecular weight between about 5,000 and about 30,000 g/mol.

A fifth aspect, according to the method of any of the first through fourth aspects, wherein the second polymer is an aliphatic polyurethane or a styrene butadiene.

A sixth aspect, according to the method of any of first through fifth aspects, further comprising the step of curing the adhesive material at a temperature of greater than or equal to about 70 degrees Celsius.

A seventh aspect, according to the method of any of the first through sixth aspects, wherein the applying step is accomplished using a flexographic printing system.

According to an eight aspect, an electronic device comprising; a pattern of a conductive adhesive material applied to a surface of a substrate; and a metal disposed atop the pattern of conductive adhesive material, wherein the conductive adhesive material secures the metal to the substrate.

A ninth aspect, according to the electronic device of the eighth aspect, wherein the conductive adhesive material comprises between about 10 and about 40 wt % of conductive carbon black.

A tenth aspect, according to the electronic device of any of the eighth or ninth aspects, wherein the conductive adhesive material comprises a conductive carbon black and two or more polymers, wherein one of the two or more polymers comprises ethylene acrylic acid copolymer.

An eleventh aspect, according to the electronic device of any of the eighth through tenth aspects, wherein the metal is coupled to an electronic component.

A twelfth aspect, according to the electronic device of any of the eighth through eleventh aspects, wherein the conductive adhesive material conducts electricity over localized disruptions of the electrical conductivity of the metal.

According to a thirteenth aspect, an adhesive composition includes from about 2 to about 15 wt % of a first polymer; from about 2 to about 15 wt % of a second polymer; from about 3 to about 15 wt % of a conductive carbon black dispersion; and a viscosity modifier. The first polymer is an ethylene acrylic acid copolymer, the second polymer is an aliphatic polyurethane or a styrene butadiene, and the adhesive composition has a viscosity between about 1,000 mPa-s and about 3,000 mPa-s.

A fourteenth aspect, according to the adhesive composition of the thirteenth aspect, wherein the adhesive composition includes from about 2 to about 15 wt % of the first polymer, from about 2 to about 15 wt % of the second polymer, and from about 3 to about 15 wt % of the carbon black dispersion, and greater than about 75 wt % of water.

A fifteenth aspect, according to the adhesive composition of any of the thirteenth and fourteenth aspects, wherein the first polymer is an ethylene acrylic acid copolymer.

A sixteenth aspect, according to the adhesive composition of any of the thirteenth through fifteenth aspects, wherein the second polymer is an aliphatic polyurethane or a styrene butadiene.

A seventeenth aspect, according to the adhesive composition of any of the thirteenth through sixteenth, wherein a ratio of the first polymer to the second polymer is between about 2:1 and about 1:2.

An eighteenth aspect, according to the adhesive composition of any of the thirteenth through seventeenth aspects, wherein conductive carbon black comprises between about 10 and about 40 wt % after the adhesive composition has dried.

A nineteenth aspect, according to the adhesive composition of any of the thirteenth through eighteenth aspects, wherein a ratio of the first polymer and the second polymer to the conductive carbon black dispersion is between about 3:1 and about 1:1.

A twentieth aspect, according to the adhesive composition of any of the thirteenth through nineteenth aspects, wherein the viscosity is between about 1,000 and about 3,000 mPa-s (cP).

It is envisioned that all of the above aspects contemplated in combination in any of the other aspects disclosed herein. Other aspects and advantages will become apparent upon consideration of the following detailed description and the attached drawings wherein like numerals designate like structure throughout the specification.

DETAILED DESCRIPTION

Figure 1:
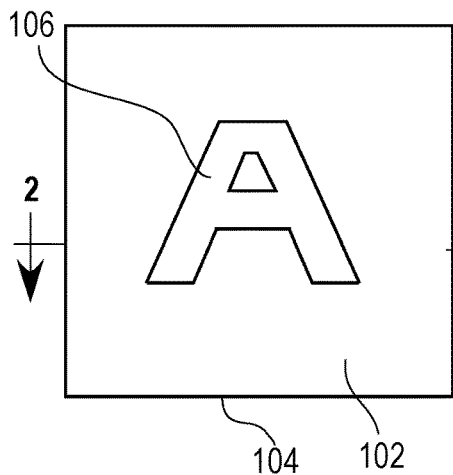
FIG. 1 is a plan view of a receiver substrate.
Figure 2:
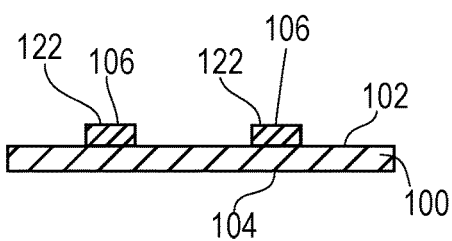
FIG. 2 is a cross-sectional view taken along the line 2-2 of the receiver substrate of FIG. 1.

Referring to FIGS. 1 and 2, a receiver substrate 100 has a first surface 102 and a second surface 104. An adhesive material 106 is deposited on the first surface 102 in a pattern associated with an image. In some embodiments, the adhesive material 106 is allowed to dry and become inactive. In some cases, the adhesive material 106 thereafter may be activated by application of energy (such as heat, visible light, invisible light, or another form of energy) and/or pressure. The receiver substrate may be coated or uncoated paper, plastic, polyethylene, a metal, or any substrate on which the adhesive material 106 may be deposited. It will be appreciated that the terms adhesive material, conductive adhesive material, and conductive carbon black adhesive material are used interchangeably herein.

In some embodiments, one or more portions of the first surface 102 are receptive to the adhesive material 106 and other portions may not be receptive to such adhesive material 106. In such embodiments, the adhesive material 106 is applied in a pattern in the portion of the first surface 102 that is receptive to adhesive material to form image and non-image areas in such portion.

In some embodiments, the adhesive material 106 may be selectively deposited in a pattern onto the first surface 102 by a jetting device. The jetting device may be, for example, an inkjet head such as a Kyocera KJ4B Printhead, manufactured by the Kyocera Corporation, Kyoto, Japan, a Fuji Samba series or Dimatix series inkjet head manufactured by Fujifilm Dimatix, Inc., of Santa Clara, Calif. U.S. Provisional Patent Application No. 61/903,829, filed Nov. 13, 2013, discloses an adhesive material 106 that may be deposited by a jetting device. The entire contents of this application are incorporated herein by reference.

Figure 3:
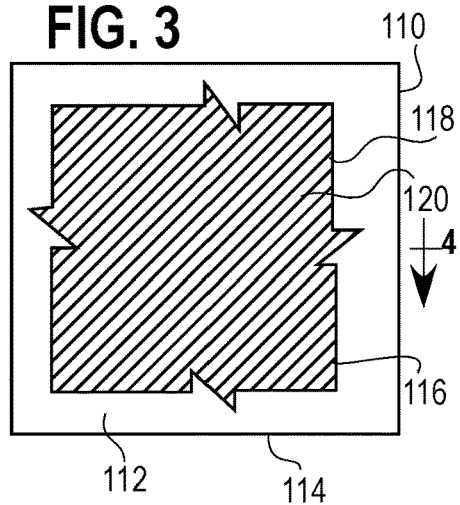
FIG. 3 is a plan view a carrier substrate.
Figure 4:
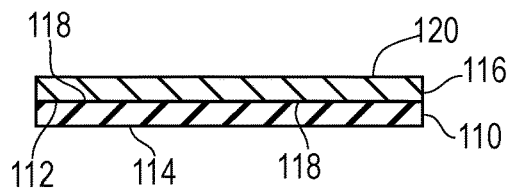
FIG. 4 is a cross-sectional view taken along the line 4-4 of the carrier substrate of FIG. 3.

Referring to FIGS. 3 and 4, a carrier substrate 110 has a first surface 112 and a second surface 114. A metal foil layer 116 is disposed on at least a portion of the first surface 112. An inner surface 118 of the metal foil layer 116 faces and is adhered to the first surface 112. In some embodiments, the inner surface 118 of the metal foil layer 116 is adhered to the first surface 112 by an adhesive layer (not shown) therebetween. In other embodiments, the metal foil layer 116 adheres to the first surface 112 because of an electrical or chemical attraction, or a chemical bond therebetween. The metal foil layer 116 may comprise aluminum, silver, copper, gold, a metal alloy, other electrically conductive materials, and the like. In some embodiments, the carrier substrate 110 having the metal foil layer 116 disposed thereon may be coated or uncoated paper, plastic, polyethylene, or another substrate receptive to the metal.

Figure 5:
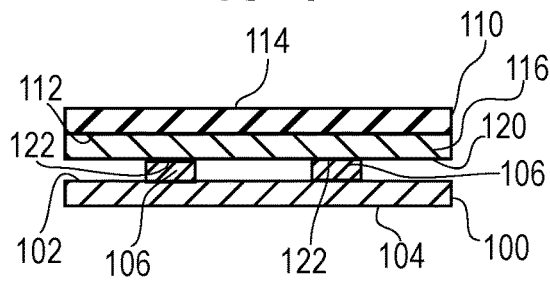
FIG. 5 is a cross-sectional view of the receiver substrate of FIG. 1 and the carrier substrate of FIG. 3 in contact with one another.
Figure 7:
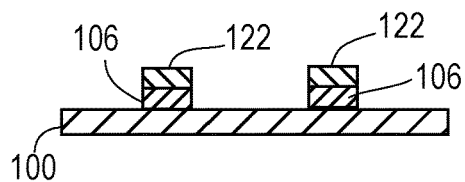
FIG. 7 is a cross-sectional view taken along the line 7-7 of the receiver substrate of FIG. 6.
Figure 6:
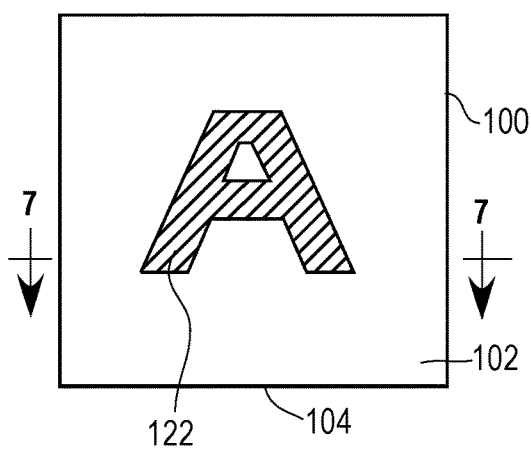
FIG. 6 is a plan view of the receiver substrate of FIG. 1 after a metal foil has been transferred thereto.

Referring to FIGS. 5-7, in order to transfer a selected portion the metal foil layer 116 to the receiver substrate 100 from the carrier substrate 110, the receiver substrate 100 and carrier substrate 110 are brought together so that the first surface 102 of the receiver substrate 100 and the first surface 112 of the carrier substrate 100 face each other, and a top surface 120 of the metal foil layer 116 contacts a top layer 122 of the adhesive material 106. In some embodiments, the adhesive material 106 may be activated by, for example, application of energy thereto before the receiver substrate 100 and the carrier substrate 110 are brought together in this manner. In other embodiments, the adhesive material 106 may be activated by application of energy and/or pressure after the receiver substrate 100 and the carrier substrate 110 are brought together. In still other embodiments, the adhesive material 106 may be activated before the receiver substrate 100 and the carrier substrate 110 are brought together, and then further activated while the adhesive material 106 and the metal foil layer 116 are in contact with one another.

The adhesive material 106, the carrier 110, and the metal foil layer 116 are selected so that when a portion of the metal foil layer 116 contacts the activated adhesive material 106, such portion of the metal foil layer 116 adheres more strongly to the adhesive material 106 than to the first surface 112 of the carrier 110. Thereafter, the substrate 100 and the carrier 110 are pulled away from one another. A portion 122 of the metal foil layer 120 separates from the first surface 112 of the carrier 110, remains atop the pattern of the adhesive material 106, and is thus transferred to the substrate 100. The portion 122 of the metal foil layer 120 that remains atop the pattern of the adhesive material 106 substantially duplicates the pattern of the adhesive material 106. In some embodiments, if the adhesive material 106 is a heat activated adhesive, the activated adhesive material 106 is allowed to cool below an activation temperature after the portion 122 of the metal foil layer 120 is contacted thereto, and before the substrate 100 and the carrier are separated from one another. Allowing the adhesive material 106 to cool in this manner may improve the bond between the portion 122 of the metal foil layer 120 and the pattern of the adhesive material 106.

Figure 8:
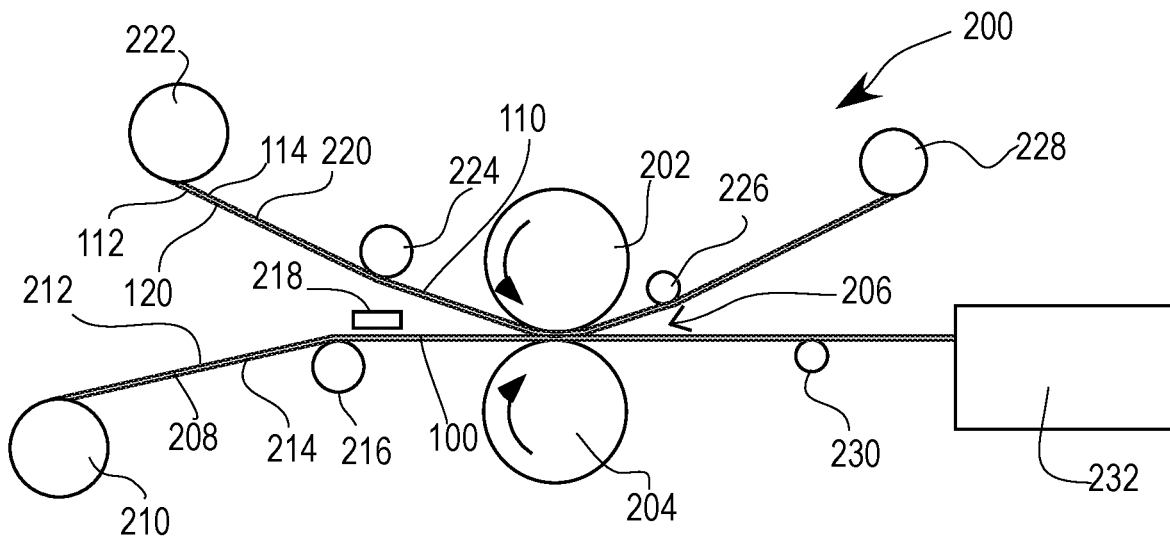
FIG. 8 is a schematic view of an embodiment of a system to transfer metal from a carrier substrate to a receiver substrate.

Referring to FIG. 8, an embodiment of a system 200 for transferring the metal foil to the receiver substrate 100 from the carrier substrate 110 includes a first cylinder 202, a second cylinder 204, and a nip 206 therebetween. In some embodiments, the receiver substrate 100 may be supplied as a web 208 from a supply roll 210. The web 208 has a first surface 212 and a second surface 214. One or more guide rollers 216 guide the web past an adhesive applicator 218 and into the nip 206. The adhesive applicator 218 deposits a pattern of the adhesive material 106 onto the web 208 to form the receiver substrate 100.

Concurrently, a web 220 of the carrier substrate 110 is supplied from a supply roll 222 and guided by one or more rollers 224 into the nip 206. As described above, the web 220 of the carrier substrate 110 has a first side 112, onto which a layer of metal foil 120 has been previously disposed, and a second side 114. The webs 208 and 220 are guided into the nip 206 such that the first side 212 of the web 208 faces the first side 112 of the web 220. The first cylinder 202 and the second cylinder 204 apply pressure to the two webs 208 and 220 when such webs 208 and 220 are in the nip 206. Such pressure activates the adhesive material 106 on the first side 212 of the web 208. In some embodiments, one or both of the cylinders 202 and 204 may be heated, and such heat may activate the adhesive material 106 when the web 208 is in the nip 206. Any portion of the metal foil layer 120 that is in contact with the adhesive material 106 on the first side 212 is thus bonded thereto.

The two webs 208 and 220 then exit the nip 206. The web 220 of the carrier substrate 110 is guided by one or more guide rollers 226 to a take up cylinder 228 and wound thereon. After portions of the metal foil layer 120 from the carrier substrate 110 are transferred to the web 208, one or more guide rollers 230 guide such web to a finishing station 232. In some embodiments, the finishing station 232 may simply be take-up reel on which the web 208 is wound. In other embodiments, the finishing station 232 may include one or more of a cutter, folder, stacker, inserter, and the like. In addition, if the metal foil layer 120 is deposited onto the web 208 of the receiver substrate 100 in a pattern associated with one or more conductive traces of an electronic circuit, the finishing station 232 may include apparatus for placing electronic components onto such electronic circuit. Electronic components include, among other things, a circuit, an integrated circuit, a battery, an LED, a memory chip, a sensor, an antenna, a conductive trace, a terminal, a resistor, a capacitor, a semiconductor, a diode, a power source, or a switch.

In some embodiments, the adhesive applicator 218 may form the pattern of adhesive material 106 on top of the layer of metal foil 120 disposed on the web 220, instead of forming such pattern on the web 208. The two webs 208 and 220 may be transported through the nip 206 as described above, and the portion of the metal foil 120 that are covered by the pattern of adhesive material 106 is transferred to the web 208.

It will be apparent to those who have skill in the art, that the system 200 may include control systems to synchronize the transport of the webs 208 and 220, the adhesive applicator 218, the cylinders 202 and 204, the guide rollers 216, 224, 226, and 230, the take-up reel 228, and/or the finishing station 232.

Figure 9:
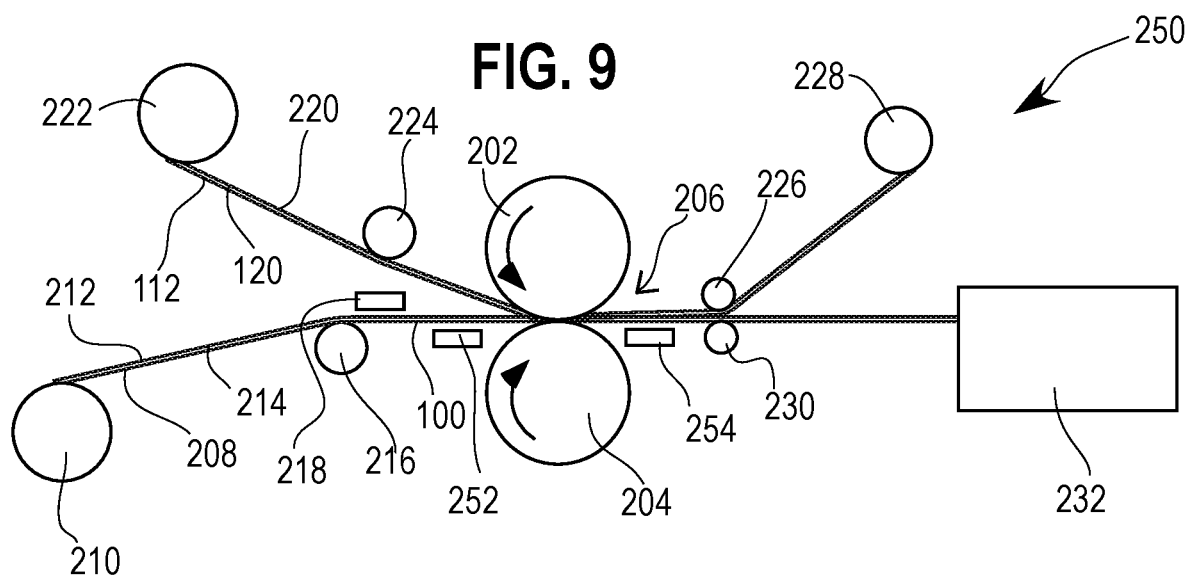
FIG. 9 is a schematic view of another embodiment of a system to transfer metal from a carrier substrate to a receiver substrate.

Referring to FIG. 9, another embodiment of a system 250 is similar to the system 200 described above, except the system 250 may include an adhesive activation unit 252 and/or a bond formation unit 254. The adhesive activation unit 252 is disposed along the path of the web 208 after the adhesive applicator 218 deposits the adhesive material 106 onto the web 208 and before the web 208 enters nip 206. The adhesive activation unit 252 activates the adhesive material 106 before such material contacts the metal foil layer 120 on the web 220. The adhesive activation unit 252 may be a heater, a light emitter, a pressure applicator, an activating agent applicator, and the like. It will be apparent to those who have skill in the art, that the adhesive activation unit 252 may be selected in accordance with the activation properties of adhesive material 106.

The bond formation unit 254 may be a device that facilitates formation and/or strengthening of a bond between the pattern of the adhesive material 106 and the portion of the metal foil layer 120 contacted therewith. In some embodiments, the webs 208 and 220 remain in contact as such webs exit the nip 206 and travel past the bond formation unit 254. In other embodiments, the webs 208 and 220 may be separated after the exit from the nip 206 and before the web 208 reaches the bond formation unit 254.

The bond formation unit 254 may include a chiller, a light emitter, a curing device, and the like. In some embodiments, the bond formation unit 254 applies an agent to the web 208 that facilitates formation and/or strengthening of the bond between the adhesive material 106 and the portion of the metal foil layer 120 deposited thereon.

Figure 10A:
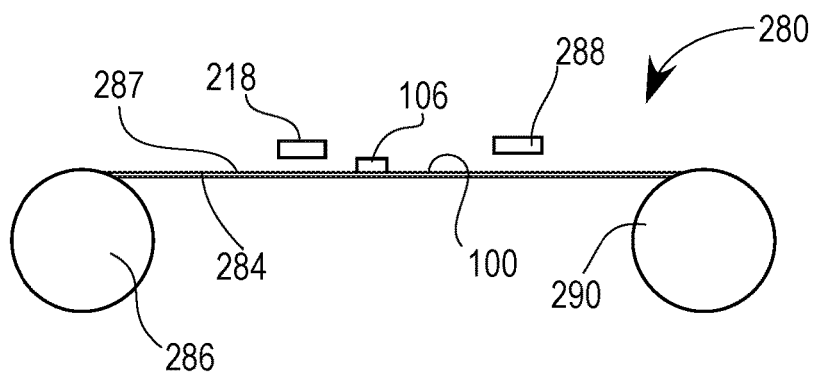
FIG. 10A is a schematic view an embodiment of a system to produce a web of a receiver substrate.
Figure 10B:
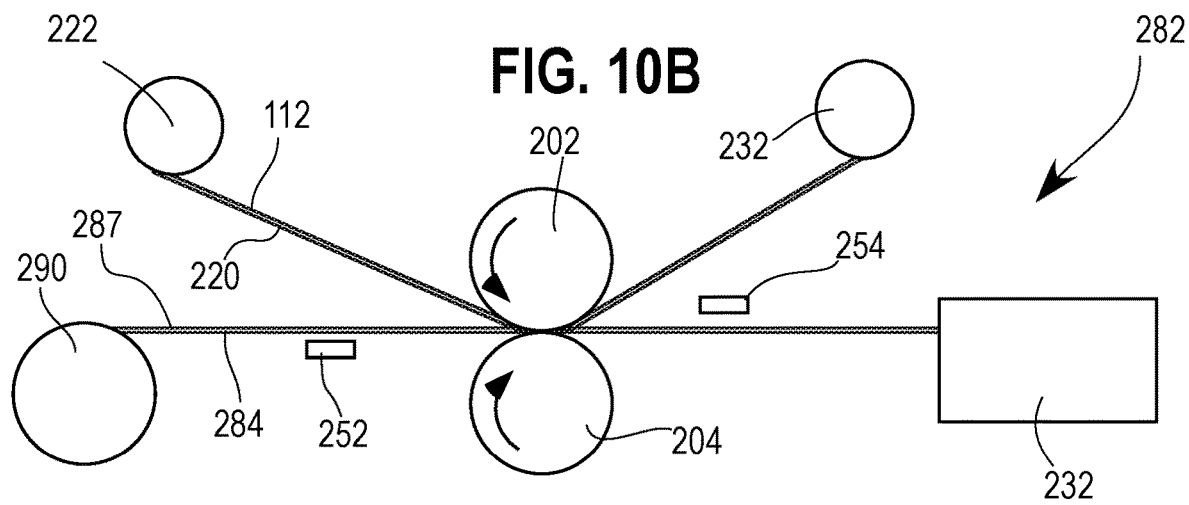
FIG. 10B is a schematic view of a system to transfer metal from a carrier substrate to the receiver substrate produced using the system of FIG. 10A.

Referring to FIGS. 10A and 10B, in some embodiments a web of carrier substrate may be manufactured using a receiver manufacturing system 280 that selectively applies adhesive material 106 to define the image areas of the carrier substrate 100. The metal foil may then be transferred to such image areas using a foil transfer system 282.

For example, referring to FIGS. 10A and 10B, in the receiver manufacturing system 280, a web 284 may be transported from a supply reel 286 and past the adhesive applicator 218, which applies the pattern of the adhesive material 106 to a surface 287 of the web 284. In some embodiments, a dryer 288 may then dry the adhesive material 106. The web 284 with adhesive material 106 thereon may be wound onto a take-up reel 290. The take-up reel 290 may be stored until metal foil is to be transferred thereto.

To transfer the metal foil, the take-up reel 290 may be used in the foil transfer system 282. In particular, the web 284 is unwound from the take-up reel 290 and brought into contact with a web 220 of carrier material in the nip 206, as described above. The adhesive activation unit 252 and/or the bond formation unit 254 may be used as described above in the foil transfer system 282. After the web 284 exits the nip, such web is transported to the finishing system 232.

Control systems, transport systems, and guide rollers are not depicted FIGS. 10A and 10B to simplify such drawings. The use of these systems and rollers in the systems depicted in FIGS. 10A and 10B will be apparent to those who have skill in the art.

Figure 11:
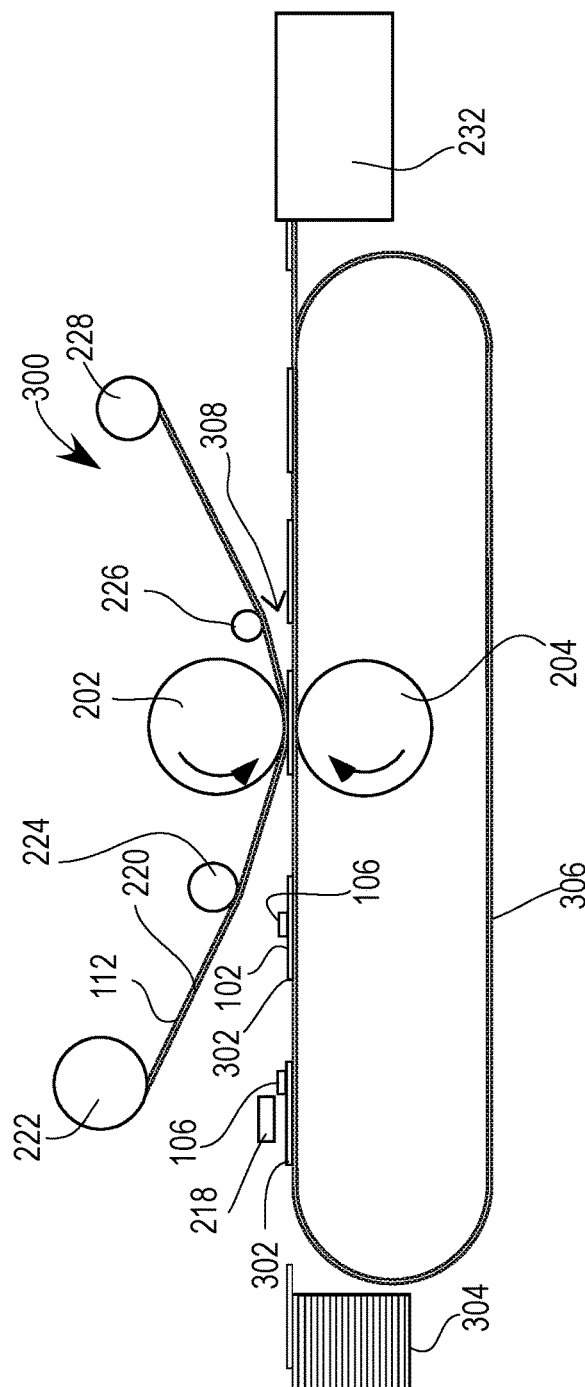
FIG. 11 is a schematic view of yet another embodiment of a system that may be used to transfer metal from a carrier substrate to a receiver substrate.

Although the embodiments of systems depicted in FIGS. 8-10 illustrate the receiver substrate 100 and carrier substrate 102 supplied as webs 208 and 220, one or both of these substrates may be supplied as sheets. For example, referring to FIG. 11, in an embodiment of a system 300, sheets 302 of the receiver substrate 100 are supplied from a stack 304 of such sheets and placed on a conveyor 306. The conveyor transports the sheet 302 past the adhesive applicator unit 218, which applies the pattern of the adhesive material 106 onto the sheet 302. The sheet 302 continues into a nip 308 formed between the cylinders 202 and 204. In some embodiments, the cylinder 204 may not be necessary, and the nip 308 is formed between the cylinder 202 and the conveyor 306.

Concurrently, one or more guide rollers 224 transport the web 220 of the carrier substrate 112 into the nip 308. The cylinders 202 and 204 apply energy and/or pressure to facilitate adhesion of portions of the metal foil layer 120 to the pattern of adhesive 106 formed by the adhesive applicator unit.

Thereafter, the sheet 302 with portions of the metal layer 120 transferred thereto is transported from the nip 308 by the conveyor to the finishing unit 232. The web 220 is transported from the nip 308 to the take-up reel 228. In some embodiments, one or more guide rollers 226 transport the web 220 to the take up reel 228.

Figure 12:
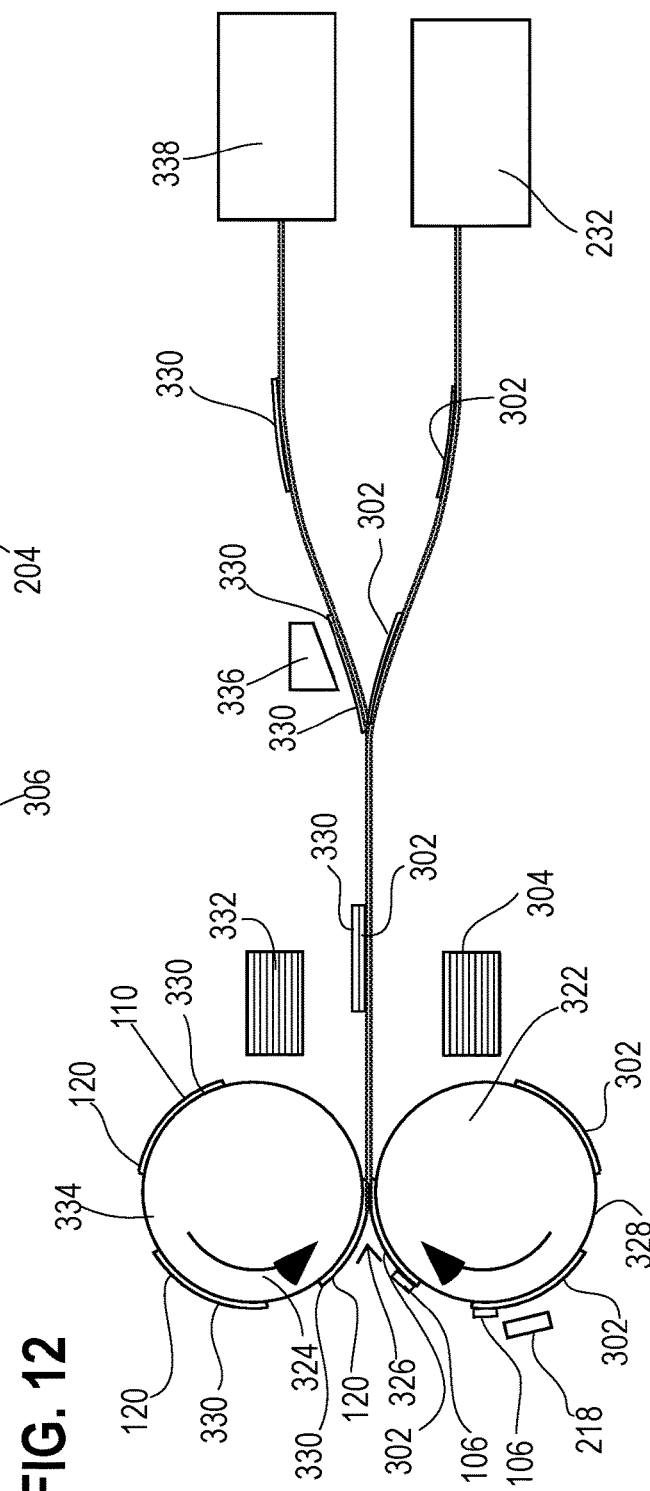
FIG. 12 is a schematic view of still yet another embodiment of a system that may be used to transfer metal from a carrier substrate to a receiver substrate.

Referring to FIG. 12, in some embodiments, a system 320 includes cylinders 322 and 324 that are disposed to form a nip 326 therebetween. The sheets 302 of the receiver substrate 100 are supplied from the stack 304 of such sheets, and secured to an outer surface 328 of the cylinder 322. Concurrently, sheets 330 of the carrier substrate 110 are supplied from a stack 332 and secured to an outer surface 334 of the cylinder 324. The sheets 302 and 330 may be secured to the surfaces 328 and 334, respectively, using one or more of a vacuum source, electrostatic charge, a clamp, and other ways apparent to those who have skill in the art.

Rotation of the cylinder 322 transports each sheet 302 on the surface 328 thereof past the adhesive application unit 218 and into the nip 326. The adhesive application unit 218 applies the pattern of adhesive material 106 onto the sheet 302 as described above. In some embodiments, an application unit 218 applies the pattern of adhesive material 106 onto the sheet 330 in addition to or instead of the sheet 302. Rotation of the cylinder 324 transports each sheet 330 on the surface 334 thereof into the nip 326. The operation of the cylinders 322 and 324 are synchronized so that the sheet 302 and the sheet 330 enter the nip 326 concurrently. Portions of the metal foil layer 120 from the sheet 330 are transferred on top of the pattern of adhesive material 106 on the sheet 302 as described above.

The sheets 302 and 330 may emerge from the nip 326 with one sheet stacked atop the other. A sheet separator unit 336 separates the sheet 302 from the sheet 330. The sheet 302 with metal transferred thereto may be transported to the finishing unit 232. The sheet 330 may be transported to a carrier material collector 338 that collects and stores the carrier substrate 112 from which portions of the metal foil layer 120 have been removed. Such collected carrier substrate 112 may be recycled, reused, and/or disposed.

The printing process described in the foregoing may be used to transfer materials other than a metal foil from carrier substrate 110 to a receiver substrate 100. For example, metals and other conductors, semi-conductors, and insulators may be applied in such manner to form an electronic product having one or more conductive, semi-conductive, and/or insulating layers on the receiver substrate 100. For example, instead of a metal foil layer 120, a layer of a non-metal material may be disposed on at least a portion of the first surface 112 of the carrier substrate 110. Thereafter, as described above, portions of the layer of a non-metal material may be transferred from the carrier substrate 110 to the portions of a receiver substrate where the pattern of adhesive material 106 has been deposited.

If the non-metal material is also an insulator, patterns of a metal material (or other conductive material) and such non-metal material may be deposited one after another on the receiver surface to form a multi-layer circuit thereon. Examples of insulating materials include an acrylic, polytetrafluoroethylene, polyester, polypropylene, and the like.

Figure 13:
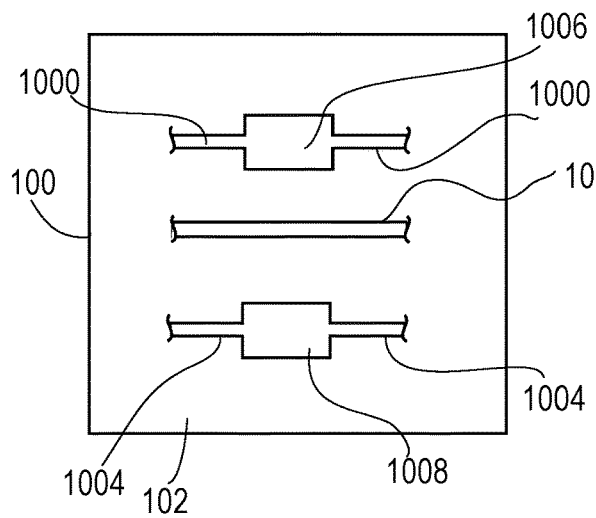
FIG. 13 is a plan view of the receiver substrate of FIG. 1 with conductive traces transferred thereto.

Referring to FIG. 13, the surface 102 of the receiver substrate 100 may have conductive traces 1000, 1002, and 1004, formed thereon by depositing a conductive material as described herein above. The conductive traces 1000, 1002, and 1004 may be portions of one or more circuits deposited on the surface 102. Only the portions 1000, 1002, and 1004 are illustrated for simplicity. However, such traces 1000, 1002, and 1004 may be coupled to other conductive traces (not shown) or electrical components (not shown) deposited on the surface 102.

The conductive trace 1000 may include a rectangular portion 1006 and the conductive trace 1004 may include a rectangular portion 1008. It should be apparent that the portions 1006 and 1008 may be any other shape.

One or more of the conductive traces 1000, 1002, and 1004 may be deposited using the metal transfer process described above, or may be deposited using another metal deposition processes including a printing process. Such processes may include flexographic printing, inkjet printing, gravure printing, lithographic printing, foil stamping, and the like.

Figure 14:
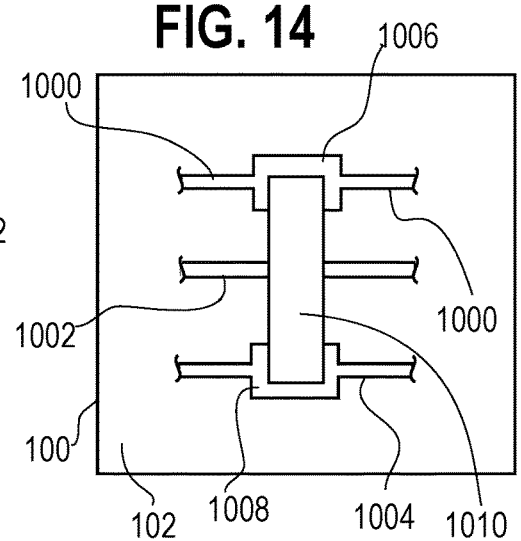
FIG. 14 is a plan view of the receiver substrate of FIG. 13 with a first pattern of adhesive deposited thereon.

Referring to FIG. 14, a first pattern of adhesive material 1010 may be deposited on the surface 102 such that the first pattern of adhesive material 1010 covers at least a portion of each conductive trace 1000, 1002, and 1004.

Figure 15:
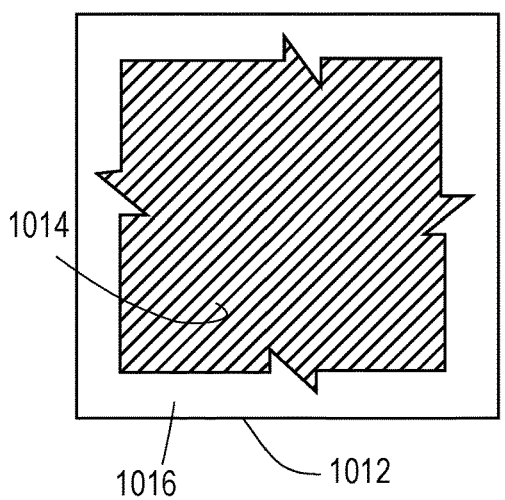
FIG. 15 is a plan view of a carrier substrate having a layer of insulating material.

Referring to FIG. 15, a carrier substrate 1012 has a layer of insulating material 1014 deposited on a surface 1016 thereof.

Figure 16:
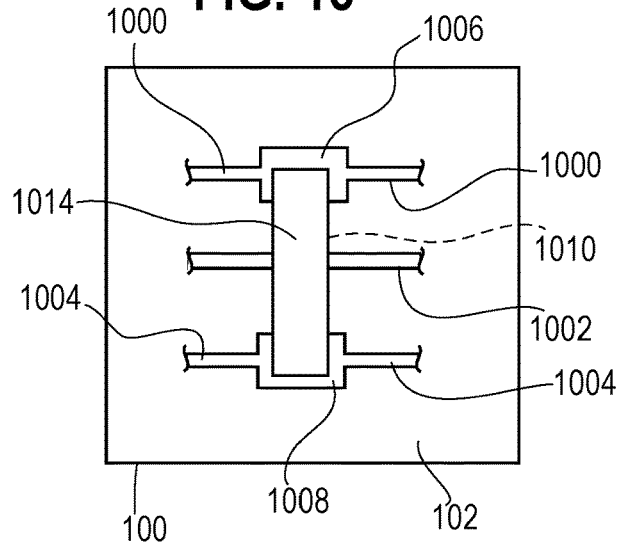
FIG. 16 is a plan view of the receiver substrate of FIG. 14 with insulating material transferred thereto.

The receiver substrate 100 with the conductive traces 1000, 1002, and 1004, and the first pattern of adhesive material 1010 is brought into contact with the carrier substrate 1012 such that the surface 102 of the receiver substrate 100 and the surface 1016 of the carrier substrate 1012 face one another. Energy and/or pressure may be applied so that a portion of the non-conductive material 1014 that contacts the first pattern of adhesive material 1010 may bond with such pattern of adhesive material 1010 and thereby may be transferred to the receiver substrate 102. If necessary, the first pattern of adhesive material 1010 may be activated by pressure and/or energy before and/or during such contact. FIG. 16 illustrates the receiver substrate 100 after the non-conductive material 1014 has been transferred thereto.

Figure 17:
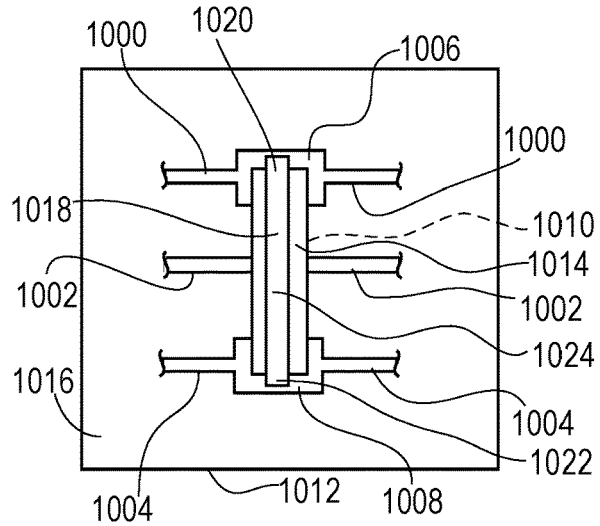
FIG. 17 is a plan view of the receiver substrate of FIG. 16 with a second pattern of adhesive material deposited thereon.

Referring to FIG. 17, a second pattern of adhesive material 1018 is deposited onto the receiver substrate 100. The second pattern of adhesive material 1018 includes portions 1020 and 1022 that contact the rectangular portions 1006 and 1008, respectively. The non-conductive material 1014 on the receiver substrate 100 separates a second portion 1024 of the second pattern of adhesive material 1018 from the conductive trace 1002.

In some embodiments, a solder material (not shown), for example, a low temperature solder may be applied on top of and/or adjacent to portions of one or both of the conductive trace 1000 and the conductive material 1028. Such solder material may facilitate bonding between, for example, such conductive trace 1000 and/or conductive material 1028 and one or more pins of a component placed thereon. In some embodiments, the solder material may be deposited using one of the printing processes noted above.

Figure 18:
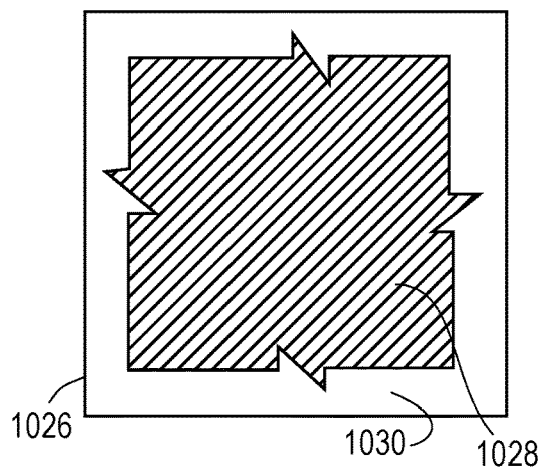
FIG. 18 is a plan view of a carrier substrate having a layer of conductive material.
Figure 19:
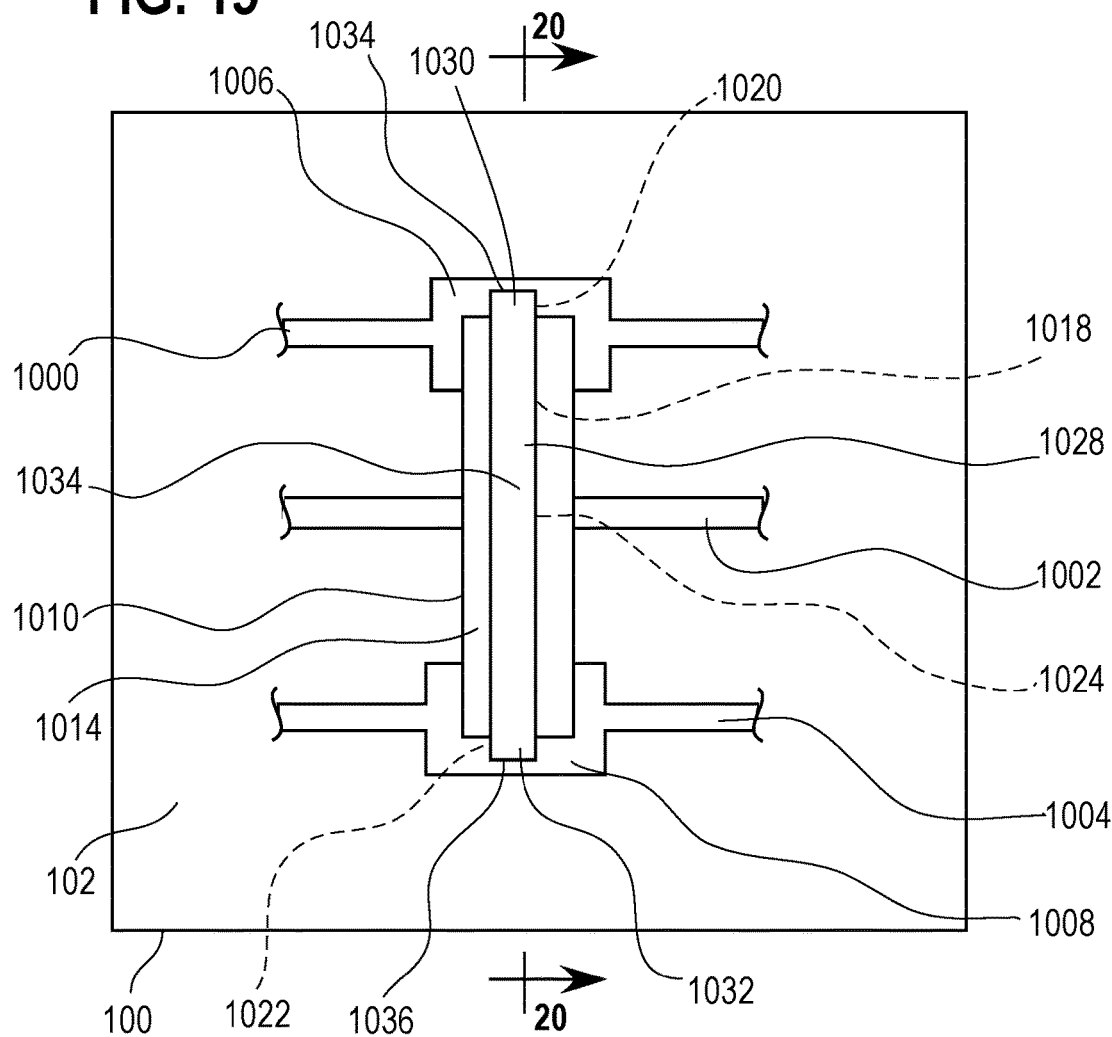
FIG. 19 is a plan view of the receiver substrate of FIG. 17 with conductive material transferred thereto.

Referring to FIG. 18, a carrier substrate 1026 has a layer of a conductive material 1028 deposited on a surface 1030 thereof. The conductive material 1028 may be brought into contact with the second pattern of adhesive material 1018, and the portion of the conductive material 1028 in contact with the second pattern of adhesive material 1018 may be transferred to the receiver substrate 100. In some embodiments, the second pattern of adhesive material 1018 may be activated using energy and/or pressure before and/or during such contact. FIG. 19 illustrates the receiver substrate 100 after the conductive material 1028 has been transferred thereto.

In one embodiment, the second pattern of adhesive material 1018 may be formed using a conductive adhesive material. In such an embodiment, the portion 1020 of the conductive adhesive material may electrically couple a portion 1030 of the conductive material 1028 with the portion 1006 of the conductive trace 1000. Similarly, the portion 1022 of the conductive adhesive material may electrically couple a portion 1032 with the portion 1008 of the conductive trace 1004. Further, a portion 1034 of the conductive material 1028 that lies on top of the conductive trace 1002 is electrically isolated from such conductive trace by the pattern of the insulating material 1014 disposed therebetween. In this manner, a conductive path may be created between the conductive traces 1000 and 1004 by the second pattern of adhesive material 1018 and the conductive material 1034 deposited thereon.

Figure 20:
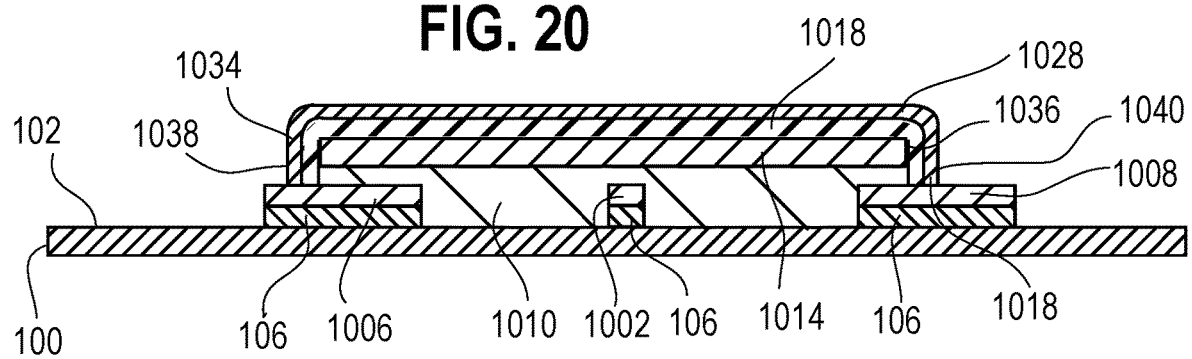
FIG. 20 is a cross-sectional view taken along the line 20-20 of the receiver substrate of FIG. 19.

In another embodiment, the second pattern of adhesive material 1018 may be formed using a non-conductive adhesive material. Referring to FIG. 20, in such embodiments, the conductive material 1028 may still create a conductive path between the traces 1000 and 1004 because conductive material 1028 may flow over edges 1034 and 1036 of the second pattern of adhesive material 1018, and contact the portions 1006 and 1008, respectively. In particular, portions 1038 and 1040 of the conductive material 1028 may thus contact with the conductive traces 1006 and 1008.

Figure 21:
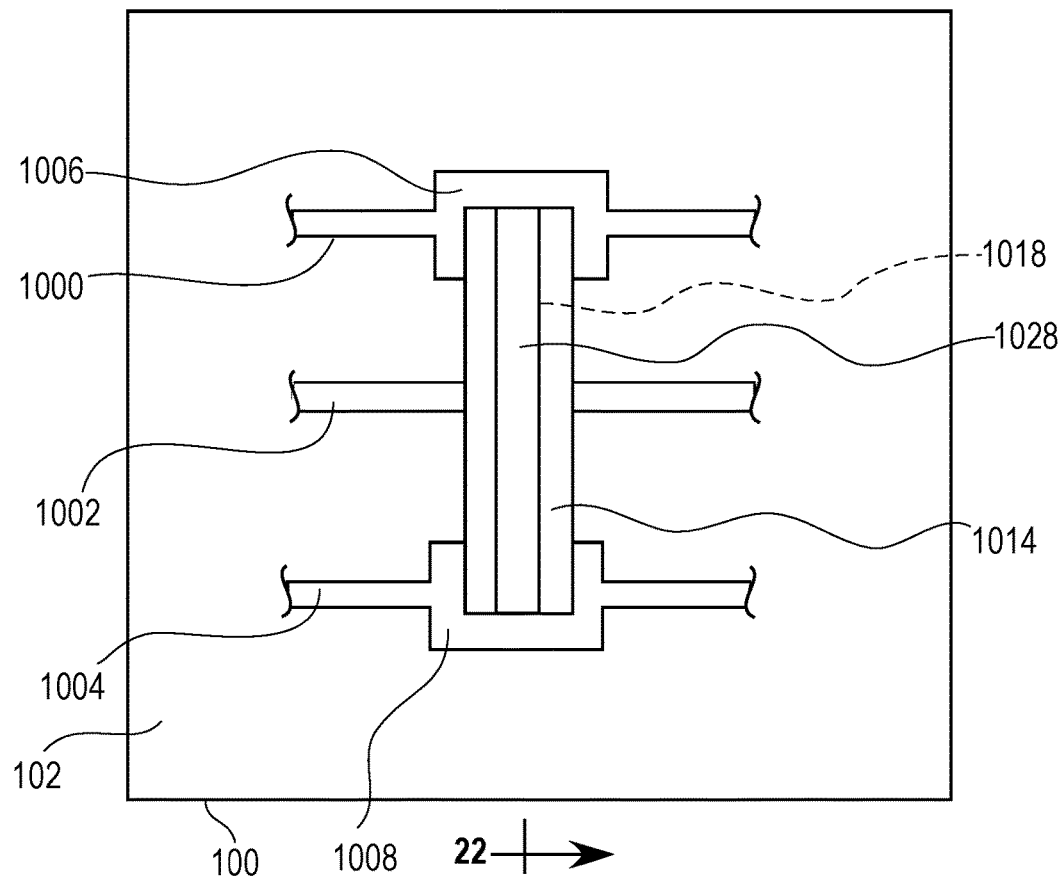
FIG. 21 is another plan view of the receiver substrate of FIG. 19.
Figure 22:
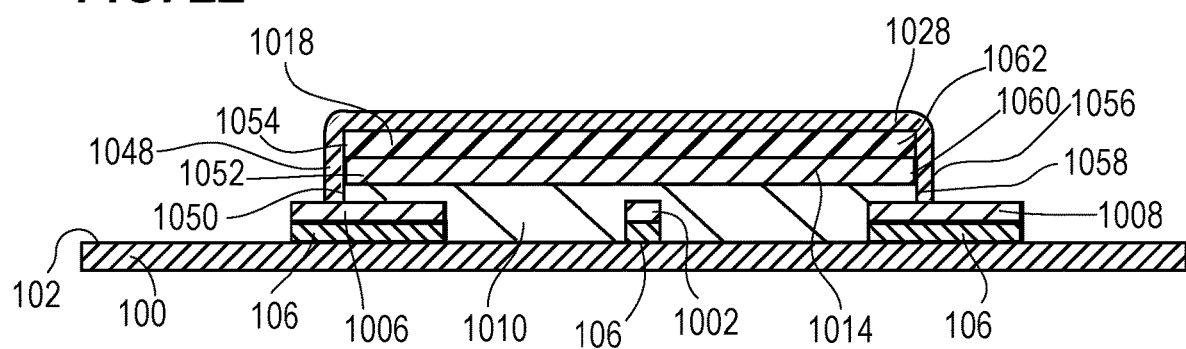
FIG. 22 is a cross-sectional view taken along the line 22-22 of the receiver substrate of FIG. 21.
Figure 23:
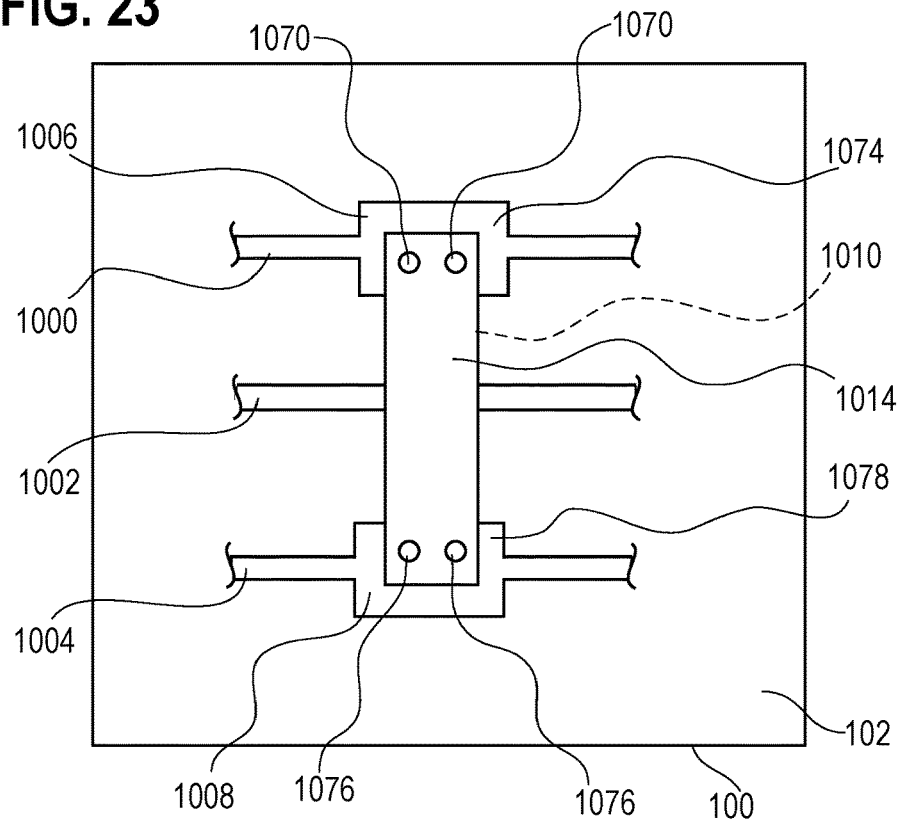
FIG. 23 is a plan view of the receiver substrate of FIG. 13 having a first pattern of adhesive material deposited thereon and an insulating material transferred thereto.
Figure 24:
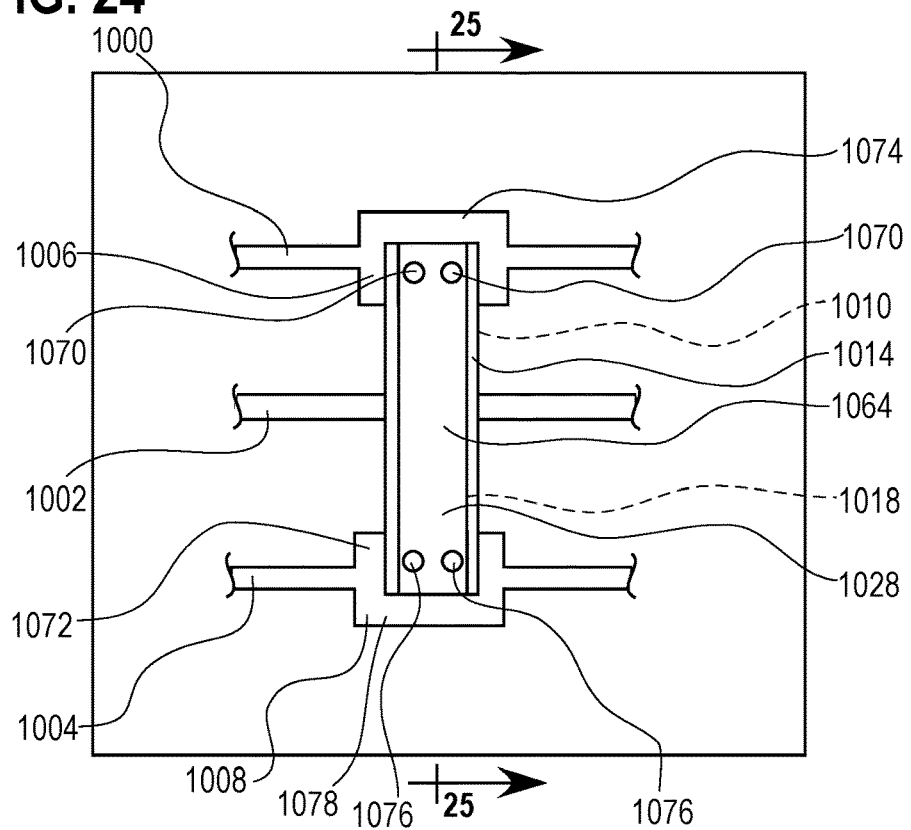
FIG. 24 is a plan view of the receiver substrate of FIG. 23 having a second pattern of adhesive material deposited thereon and a conductive material transferred thereto.
Figure 25:
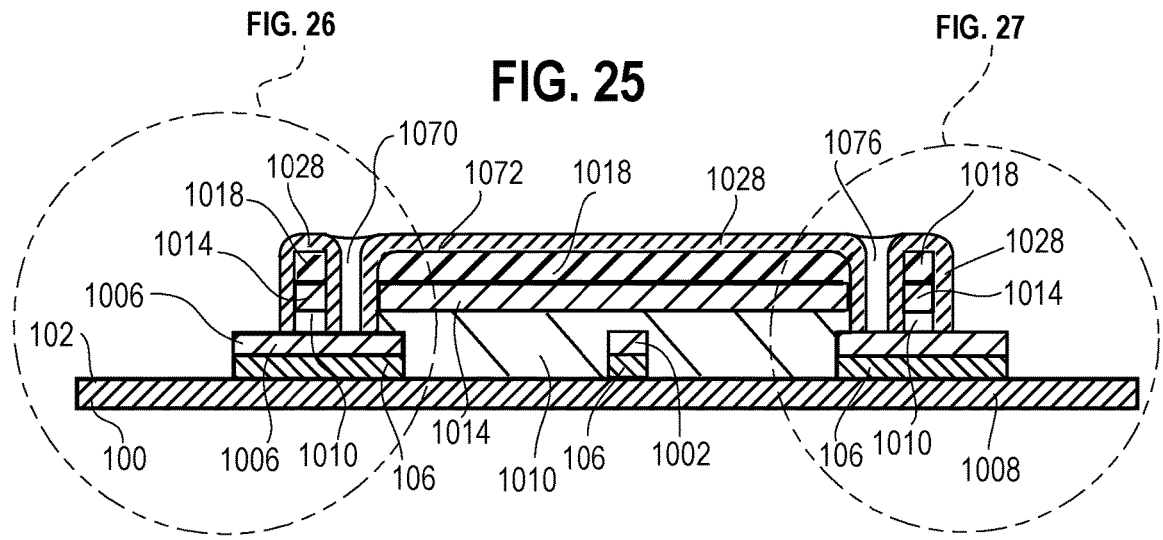
FIG. 25 is a cross-sectional view take along the line 25-25 of the receiver substrate of FIG. 24.
Figure 26:
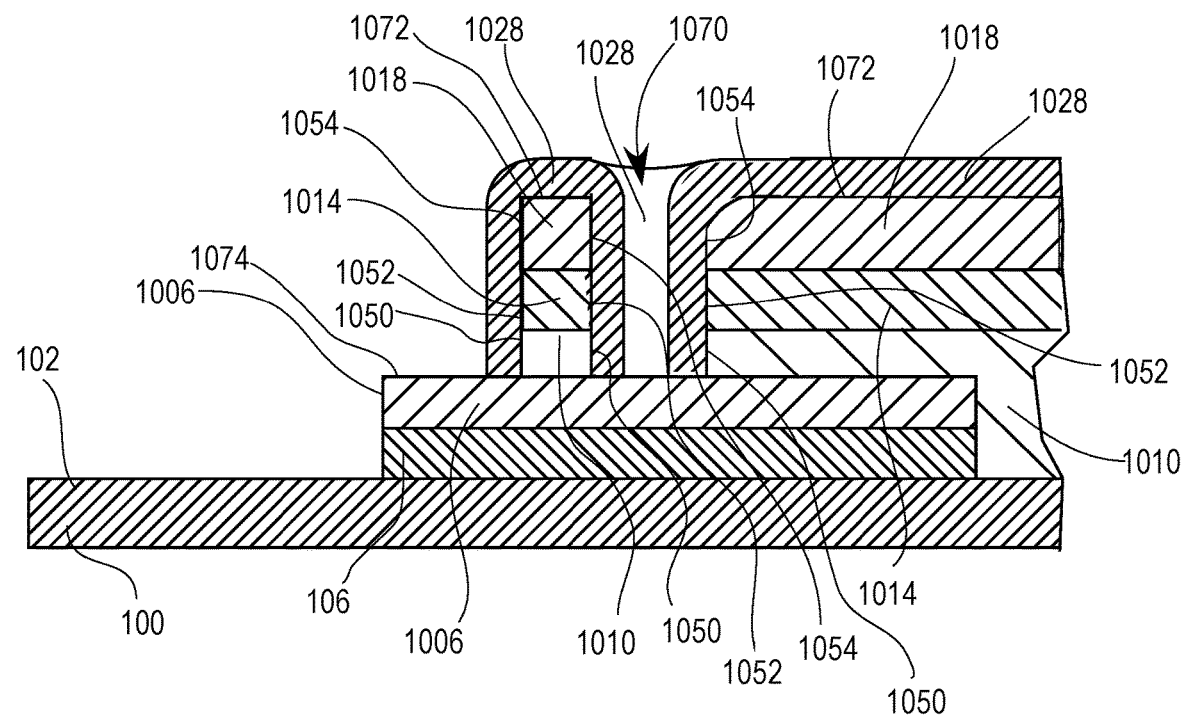
FIG. 26 is a magnified view of a portion taken from the region identified by line 26-26 of the receiver substrate of FIG. 25.
Figure 27:
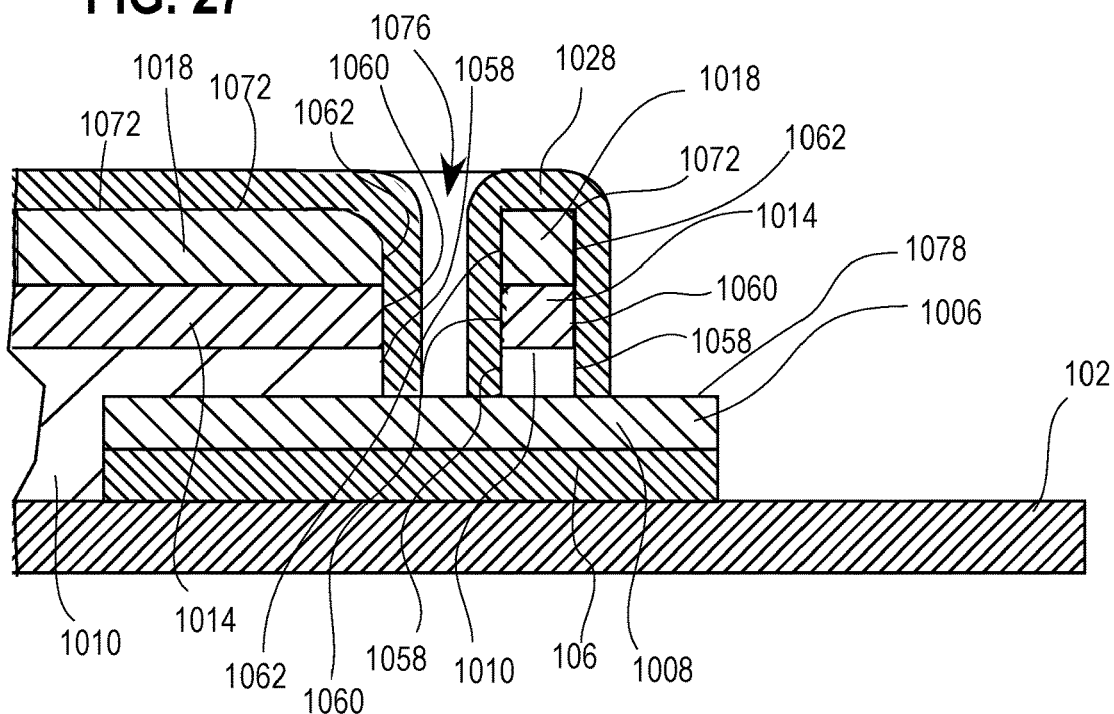
FIG. 27 is a magnified view of a portion taken from the region identified by line 27-27 of the receiver substrate of FIG. 25.

Referring to FIGS. 21 and 22, in some embodiments, the second pattern of adhesive 1018 may be printed so that no portion of such pattern extends beyond the non-conductive material 1014 to contact the portions 1006 and 1008 of the conductive traces 1000 and 1004. In such embodiments, a portion 1048 of the conductive material 1028 deposited on the surface 102 of the receiver substrate 100 flows over edges 1050, 1052, and 1054 of the first pattern of adhesive material 1010, the portion of non-conductive material 1014 on top of such first pattern, and the second pattern of adhesive material 1018 on top of the non-conductive material 1050, respectively, and contacts the portion 1006 of the conductive trace 1000. Similarly, a portion 1056 of the conductive material 1028 flows over edges 1058, 1060, and 1062 of the first pattern of adhesive material 1010, the non-conductive material 1014, and the second pattern of adhesive material 1018, respectively, and contacts the portion 1008 of the conductive trace 1004. In this manner, the portions 1006 and 1008 are electrically coupled to one another by the conductive material 1028, while being electrically isolated from the conductive trace 1002 deposited therebetween.

Referring to FIGS. 23-27, in one embodiment, the first pattern of adhesive material 1010, the non-conductive material 1014, and the second pattern of adhesive material 1018, may be deposited onto the surface 102 to create one or more vias (vertical interconnect accesses or tunnels) 1070 that extend from a top surface 1072 of the second pattern of adhesive material 1018 to a top surface 1074 of the portion 1006 of the conductive trace 1000. Further, because the conductive material 1028 flows over the edges 1050, 1052, and 1054, of the first pattern of adhesive material 1010, the non-conductive material 1014, and the second pattern of adhesive material 1018, respectively, the conductive material 1028 also flows over such edges that extend into the vias 1070. The conductive material 1028 inside the vias 1070 provides additional areas of contact between the portion 1006 of the conductive trace 1000 and the conductive material 1028.

Similarly, the first pattern of adhesive material 1010, the non-conductive material 1014, and the second pattern of adhesive material 1018, may be deposited onto the surface 102 to create one or more vias 1076 that extend from the top surface 1072 of the second pattern of adhesive material 1018 to a top surface 1078 of the portion 1006 of the conductive trace 1000. As described above, the conductive material 1028 flows over the edges 1058, 1060, and 1062, of the first pattern of adhesive material 1010, the non-conductive material 1014, and the second pattern of adhesive material 1018, respectively, the conductive material 1028 also flows over such edges that extend into the vias 1076, and provide additional areas of contact between the portion 1008 of the conductive trace 1004 and the conductive material 1028.

Providing the vias 1070 and 1076 may increase the conductivity between the conductive trace 1000 and 1004.

In some embodiments, the diameter of the via 1070 may be different in the layers of material 1010, 1014, and 1018 through which such via 1070 passes. For example, a diameter of the via 1070 may be larger in the first pattern of adhesive material 1010 than in the pattern of non-conductive material 1014, and the diameter of the via 1070 in the pattern of the non-conductive material 1014 may larger than the diameter of such via 1070 in the second pattern of the adhesive material 1018. Alternately, a diameter of the via 1070 may be smaller in the first pattern of adhesive material 1010 than in the pattern of non-conductive material 1014, and the diameter of the via 1070 in the pattern of the non-conductive material 1014 may smaller than the diameter of the via 1070 in the second pattern of the adhesive material 1018. Varying the diameter of the via 1070 may create a via 1070 having a shape of a conical or pyramidal frustum, and such shape may facilitate the flow of the conductive material 1028 towards the conductive trace 1000. The diameters of the via 1070 in the different layers may be varied in accordance with materials used to supply the conductive trace 1000 and/or the conductive material 1028.

Figure 28:
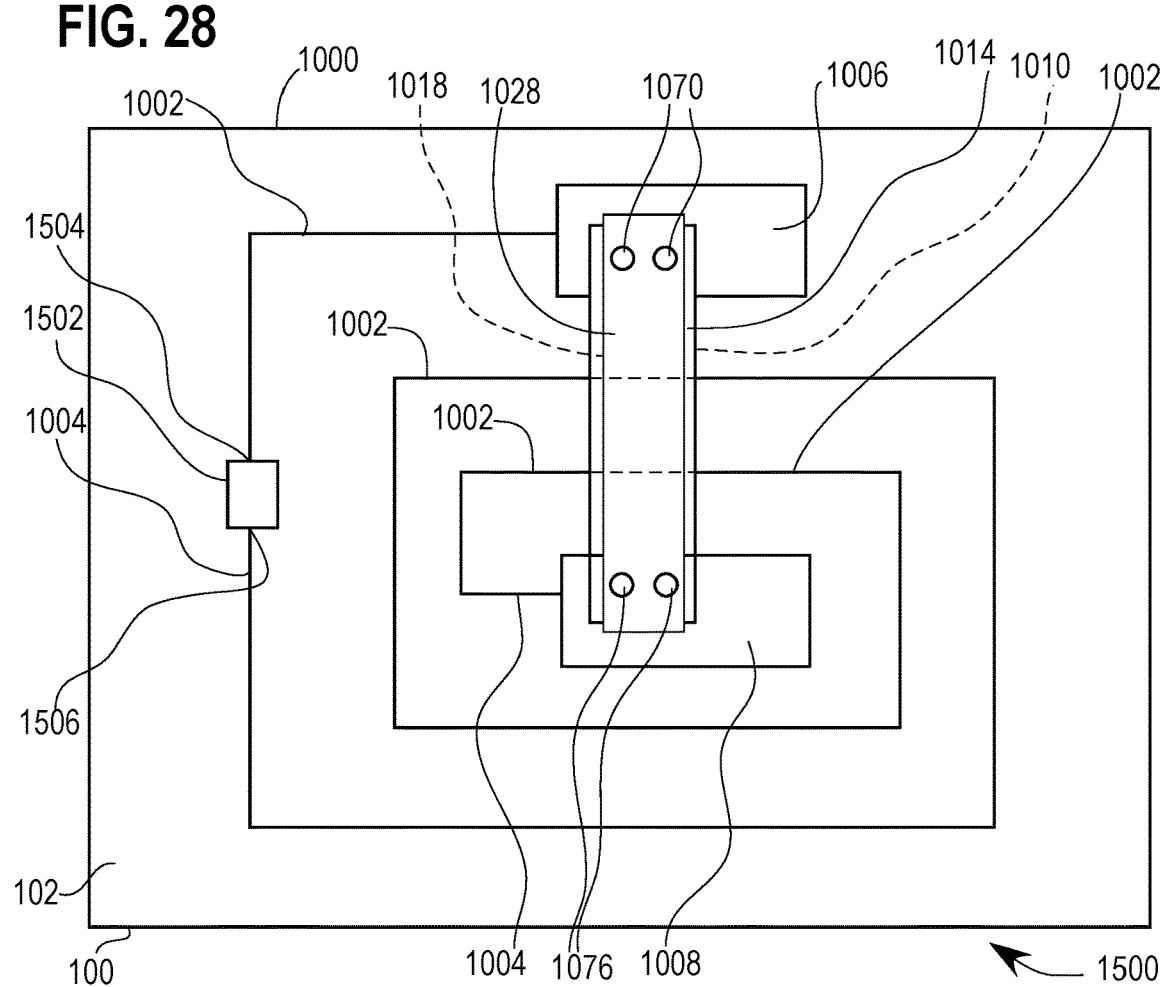
FIG. 28 is planar view of a loop antenna deposited on a receiver substrate.

Referring to FIG. 28, a loop antenna 1500 may be disposed on the surface 102 of the receiver substrate 100. Such a loop antenna 1500 may be used, for example, to provide an antenna for an RFID transceiver chip 1502. One pin 1504 of the transceiver chip 1502 may be coupled to the conductive trace 1000 of the loop antenna 1500. The conductive trace 1000 may terminate in the portion 1006. Another conductive trace 1004 of the loop antenna 1500 may be coupled to another pin 1506 of the transceiver chip 1502. The conductive trace 1004 may include one or more concentric patterns that comprise the portions 1002, and then terminate in the portion 1008. For the loop antenna 1500 to function, the terminal portions 1006 and 1008 of the conductive traces 1000 and 1004, respectively, must be conductively coupled. Further such terminal portions 1006 and 1008 may not be conductively coupled to any of the portions 1002 disposed therebetween. The first pattern of adhesive material 1010 and the non-conductive material may be deposited over portions of the terminals 1006 and 1008, and the conductive portions 1002. Thereafter, a second pattern of adhesive material 1018 and the conductive material 1028 may be deposited on top of the non-conductive portion to couple the terminal portions 1006 and 1008, as described above. The vias 1070 and 1076 may be used to improve the conductive coupling between the portions 1006 and 1008 provided by the conductive material 1028, as described above.

Referring once again to FIG. 19, it should be apparent that one or more vias as described above may be formed in the portion 1020 of the second pattern of adhesive material 1018. Thereafter, the conductive material 1028 deposited on top of the portion 1020 of the second pattern of adhesive material 1018 may flow into such vias (not shown) and directly contact the portions 1006 of the conductive trace 1004. Similarly, such vias may be formed in the portion 1022 of the adhesive material 1018 so that the conductive material 1028 deposited thereon may flow into such vias (not shown) and directly contact the portion 1008 of the conductive trace 1004. Vias may be formed in other locations that may be apparent to those who have skill in the art in order to facilitate conductive contact between the conductive material 1028 and the conductive trace 1000.

In one embodiment, the metal foil layers 118 and 1028 applied to the receiver substrate 100, may have a thickness of approximately 2,750 Angstroms, and may be between approximately 2,500 and 3,000 Angstroms thick. In other embodiments, the metal foil layers 118 and 1028 may have a thickness of between 200 and 5,000 Angstroms. Further, the patterns of adhesive material 106, 1010, and 1018 may have a thickness of approximately 1,500 Angstroms, and may be between approximately 200 and 10,000 Angstroms thick. In addition, in some embodiments, the layer of insulating material 1014 may have a thickness of between approximately 200 and 1,500 Angstroms. In one embodiment, the thickness of the layer of insulating material 1014 may be between 300 and 400 Angstroms.

In one embodiment, the carrier substrates 112 and 1026 with the metal layers 118 and 1028, respectively, may comprise copper, or other conductive metal, deposited onto an acrylic coated polyethylene substrate. In some embodiments, the insulating material 1014 may be an acrylic material, and the carrier substrate 1012 may comprise a polyethylene substrate coated with such acrylic material 1014, or another insulating material.

In some embodiments, one or more of the adhesive materials 106, 1010, and 1018 may comprise an adhesive disclosed in co-pending U.S. patent application Ser. No. 14/825,630, titled "ADHESIVE COMPOSITION FOR INKJET PRINTING," and filed on Aug. 13, 2015. The entire contents of this application are incorporated herein by reference. For example, one or more such adhesive materials 106, 1010, and 1018 may comprise a polymer, a co-solvent, a surfactant, and water. The adhesive material 106, 1010, and/or 1018 may have a viscosity such that the adhesive material 106, 1010, and/or 1018 may be applied to the receiver substrate 102 using an adhesive applicator 118 that comprises an inkjet print head. The desired viscosity of the adhesive material 106, 1010, and/or 1018 may depend in part on the requirements of the inkjet print head used and may range from about 4.0 centipoise (4.0 millipascal-seconds) to about 14 centipoise (14 millipascal-seconds). In some embodiments, the inkjet print head of the adhesive applicator 118 may deposit the adhesive material 106, 1010, or 1018 on the receiver substrate 102 as the receiver substrate 102 moves relative to such inkjet print head at a speed between about 5 feet-per-minute (0.03 meters per-second) and about 100 ft/min (0.51 meters per-second).

In one embodiment, the adhesive material 106, 1010, and/or 1018 may include about 5% to about 30%, preferably from about 6% to about 20%, and most preferably from about 8% to about 15%, by weight of a polymer. The polymer may be a hot melt adhesive that is activated by the application of heat and pressure, such as ethylene acrylic acid copolymer having a weight average molecular weight preferably ranging from about 15,000 to about 20,000 g/mol. The adhesive material 106, 1010, and/or 1018 may include about 2% to about 30%, preferably from about 4% to about 28%, and most preferably from about 5% to about 15%, by weight of a co-solvent, such as 1-(2-hydroxyethyl)-2-pyrrolidone (HEP). The adhesive material 106, 1010, and/or 1018 may include about 0.2% to about 3%, preferably from about 0.4% to about 2%, and most preferably about 0.5% to about 1.75%, by weight of a surfactant, such as a nonionic ethylene oxide, a polyacrylate-based surface additive, or other similar compounds. The balance of the adhesive may comprise water.

In one or more other embodiments in which the adhesive material 106, 1010, and/or 1018 comprises an electrically conductive adhesive material, such material is in intimate contact with the metal foil and is, therefore, in electrical parallel relationship with the adjacent foil. The conductive adhesive material may thus provide at least limited electrical conductivity even when partial or full cracks or breaks (localized disruptions in the electrical conductivity) occur in the metal foil that degrade or eliminate continuity in one or more sections thereof. Such breaks can result from various mechanical and/or environmental conditions (e.g., material and/or manufacturing defect(s), abrasion, folding, bending, etc.). Various constituent materials could be used to achieve electrical conductivity, including carbon black.

An adhesive composition of the present application includes a first polymer, a second polymer, a conductive material (carbon black dispersion), and a viscosity modifier. The adhesive composition has a viscosity such that the adhesive composition can be applied to the receiver substrate using a flexographic printing system. Viscosity is shown in centipoise (cP) units which are equivalent to millipascal-seconds (mPa-s) and may range from about 1,000 to about 3,000 mPa-s (cP).

In one embodiment, the adhesive composition may include from about 2 to about 15 wt %, preferably from about 3 to about 10 wt % of a first polymer; about 2 to about 15%, preferably from about 3 to about 10 wt % of a second polymer; about 3 to about 15 wt %, preferably from about 5 to about 10 wt % of a carbon black dispersion; and from about 0.5 to about 5 wt %, preferably from about 1 to about 3 wt % of a rheological modifier; and the balance comprising water.

The first polymer may be a hot melt adhesive that is activated by the application of heat and pressure. Specifically, the adhesive composition is applied onto the receiver substrate in a pattern. A majority of the water is vaporized once the adhesive composition is on the receiver substrate. The receiver substrate onto which the adhesive composition is applied may be maintained at an elevated temperature from about 25 degrees Celsius to about 200 degrees Celsius, to promote vaporization of the water. The receiver substrate then contacts a layer of the material carried by a carrier substrate. During the transfer process, sufficient heat and pressure are applied to the adhesive composition to activate the polymer such that a bond is formed by the adhesive composition between the receiver substrate and the material. The amount of heat and pressure required to activate the polymer depends on the properties of the polymer. In one embodiment, the applied heat may range from approximately 60 degrees Celsius to approximately 160 degrees Celsius, and the applied pressure may range from about 10 psi (68.9 kPa) to about 25 psi (172 kPa). As the carrier substrate separates from the receiver substrate, the material bonded to the receiver substrate remains on the receiver substrate in the pattern of the adhesive composition, while the remainder of the material remains on the carrier substrate.

The first polymer of the adhesive composition may be an ethylene acrylic acid copolymer. In one embodiment, the polymer has a weight average molecular weight of less than about 50,000 g/mol, preferably between about 5,000 and about 30,000 g/mol, and more preferably ranging from about 15,000 to about 20,000 g/mol. In other embodiments, it may be preferred to use a polymer having a higher molecular weight if, for example, the adhesive composition is subjected to a subsequent lamination process(es). Such further lamination may interfere with the adhesive qualities of the adhesive composition. Further, the polymer is water-dispersible. The melt point of the polymer may range from about 25 degrees Celsius to about 150 degrees Celsius, preferably about 75 degrees Celsius to about 95 degrees Celsius, although this characteristic of the polymer may be modified depending on a number of factors such as the substrate material and the amount of heat and pressure applied during the transfer process, among others. Two suitable hot melt adhesives include Michem® Prime 4990R and Michem® Prime MP4983-40R by Michelman (Cincinnati, Ohio), although other hot melt adhesives may be used.

The second polymer may be a copolymer that is used in conjunction with the first polymer (ethylene acrylic acid copolymer), such as an aliphatic polyurethane or a styrene butadiene. A suitable aliphatic polyurethane includes Daotan TW6490/35WA by Allnex. Daotan TW 6490/35WA is a waterborne, aliphatic polyurethane dispersion that is free of solvents and emulsifiers. A suitable waterborne styrene butadiene dispersion includes Encor DL313 by Arkema.

The ratio of the first polymer (wt %) to the second polymer (wt %) is between about 2:1 and about 1:2, preferably between about 1.5:1 and about 1:1.5.

The ratio of polymer (wt %) to conductive carbon black dispersion (wt %) is between about 4:1 and about 0.5:1. Preferably the ratio of the first polymer and the second polymer to the conductive carbon black dispersion is between about 3:1 and about 1:1.

Alternate polymers that maybe used are polyester, maleic anhydride, ethylene-vinyl acetate, terpolymers of ethylene-vinyl acetate-maleic anhydride, polyurethanes, copolymers of vinyl vinyl-acetate and ethylene, epoxies, polyimides, polyamides, silanes, polypropylene, styrene-maleic anhydride copolymers, acrylic resins, styrenated acrylic resins, polyvinyl alcohol, cellulosic, styrenated butadiene, styrenated-isoprene-styrene and the like.

Waxes maybe used to adjust the tack, dry melt point and, adhesion properties of the adhesive. Examples of waxes that maybe used are paraffin, candelilla, montan, carnauba, Fischer-tropsch, ethylene bis-stearamide, microcrystalline, alpha olefins, ceresin and the like.

The conductive material of the adhesive composition is added to provide a conductive property. Conductive materials include carbon fiber, carbon powder, stainless steel fiber, nickel-coated graphite, and graphene. Particularly, carbon black particles have a graphite-type crystalline structure, providing excellent electric conductivity. Carbon black subtypes include acetylene black, channel black, furnace black, lamp black, and thermal black. The conductive carbon black may be non-ionically dispersed, anionically dispersed or self-dispersed forms. Preferably, a non-ionically dispersed conductive carbon black, such as Aquablak 5909 (from Solution Dispersions, Inc.), is present in an amount ranging from about 3 to about 15 wt %, more preferably between about 5 and about 10 wt %. If the amount of carbon black is too low, the adhesive will not be conductive. However, if the amount of carbon black is too high, the mechanical and adhesive properties of the conductive adhesive composition will be adversely affected. The amount of conductive carbon black is between about 10 and about 40 wt % of the dry adhesive composition.

The primary solvent in the conductive adhesive composition is water. A cosolvent may optionally be used to provide humectancy and increases or decreases the viscosity of the composition. One or more cosolvents may act as a humectant and/or as a viscosity modifier. Examples of suitable cosolvents include 1-(2-hydroxyethyl)-2-pyrrolidone, alcohols, polyols, glycerols, or glycols, and other organic compounds.

Additionally, the adhesive composition may include a rheological modifier such as a carbopolymer or gelling agent to increase the viscosity of the adhesive composition. In one embodiment, the rheological modifier may be an alkali emulsion on an acrylic backbone such as Rheolate® 125, and in another embodiment, the modifier can be polyether polyurethane such as Rheolate® 212, both by Elementis Specialties (East Windsor, N.J.). Preferably, the viscosity of the conductive adhesive composition is between about 1,000 and about 3,000 mPa-s (cP).

Additional contemplated components in the adhesive composition include a solvent, a preservative, an anticurl agent, a humectant (e.g. propylene glycol), a wetting agent such as BYK-381 by Byk (Wallingford, Conn.), a biocide, a colorant, a surfactant, a polymer, a defoaming agent, a leveling agent, a salt, an inorganic compound, an organic compound, water, a pH modifier, and/or any combination thereof.

The conductive adhesive composition may be deposited using a printing process. Such processes may include flexographic printing, inkjet printing, gravure printing, lithographic printing, foil stamping, and the like.

Another process variable is the material onto which the adhesive composition is applied. The surface to which the adhesive composition is to be applied may be suitably prepared, processed, treated, machined, textured, or otherwise modified, if necessary or desirable. The receiver substrate may be coated or uncoated paper, plastic, polyethylene, a metal, a label stock material, or other similar materials.

In some embodiments, the adhesive composition may be applied to the receiver substrate multiple times during a manufacturing process. In one embodiment, a first layer of the adhesive composition applied atop of the receiver substrate adheres a first layer of first material such as a metal foil or an insulating material thereto in a first pattern. The metal foil may comprise aluminum, silver, copper, gold, a metal alloy, and the like. The insulating layer such as an acrylic polymer, a polyester, an acrylic copolymer, or any other material that provides a sufficient dielectric constant. During the transfer process, the first layer of material carried by a carrier substrate contacts the receiver substrate, during which heat and pressure is applied to activate the polymer of the adhesive composition. The carrier substrate then separates from the receiver substrate, and the first layer of material adheres to the receiver substrate in the first pattern. Subsequently, a second layer of the adhesive composition may be applied atop the first pattern of the first material in a second pattern. The second layer may adhere a second layer of a second material such as a metallic foil or insulating material thereto in a second pattern during a further transfer process. A third material may be applied, placed, soldered, or otherwise disposed atop of one or more of the first and second layer of the adhesive composition and the first or second layers of respective first or second materials. In some example manufacturing processes, the first and second layers of the adhesive compositions may include polymers having different molecular weights. For example, the molecular weight of the first layer of the adhesive composition may be higher than the molecular weight of the second layer of the adhesive composition so that the first layer may withstand the subsequent lamination (i.e., heat and pressure) applied during the further transfer process.

A still further option is to modulate/control the temperature of one or more process parameters. For example, one might elevate the temperature of the adhesive composition upon application thereof to the substrate to improve adherence and facilitate dispensing thereof. Alternatively, or in addition, the receiver substrate may initially be heated during application of adhesive composition to control adhesion, drop shape/size, and the like.

The following example further illustrates the disclosure but, of course, should not be construed as in any way limiting its scope. It should be noted that the method of preparing the adhesive composition may be modified as necessary depending on the size of the batch. Percentage by weight is provided.

Examples

| Formula ID | Michem Prime 4983-40R Ethylene-co-acrylic acid | Allnex Daotan TW6490/35W aliphatic polyurethane | Arkema Encor DL313 styrene butadiene | Solution Dispersions Aquablak 5909 conductive carbon black | Elementis Rheolate 212 viscosifier | water/other |
|---|---|---|---|---|---|---|
| examples | | | | | | |
| 1 | 7.00 | | 7.00 | 8.00 | 2.00 | 76.00 |
| 2 comp. | 6.36 | 7.65 | | 7.71 | 1.93 | 76.35 |

-continued

| Formula ID | Michem Prime 4983-40R Ethylene-co-acrylic acid | Allnex Daotan TW6490/35W aliphatic polyurethane | Arkema Encor DL313 styrene butadiene | Solution Dispersions Aquablak 5909 conductive carbon black | Elementis Rheolate 212 viscosifier | water/other |
|---|---|---|---|---|---|---|
| examples | | | | | | |
| 3 | 14.00 | | | 7.71 | 1.93 | 76.36 |
| 4 | 14.00 | | | 8.00 | 2.00 | 76.00 |
| 5 | 11.50 | | | 8.00 | 2.00 | 78.50 |
| 6 | 14.00 | | | 6.00 | 1.50 | 78.50 |
| 7 | 13.28 | | | 6.39 | 2.00 | 78.33 |

The component percentages above describe the amount of the active ingredient (wt %) and not the level of each ingredient used as supplied (including water or other carrier/filler). For example the relevant raw materials include Michem Prime 4983-40R nominally (40 wt % active), Allnex Daotan TW6490/35 W (35 wt. % active), Arkema Encor DL313 (49% active), Solution Dispersions Aquablak 5909 (24% active), and Elementis Rheolate (20% active). Each of these materials may contain minor components (solvents and/or dispersants) but the majority of each is composed of water.

The examples were tested for viscosity, and conductivity (or resistance), and adhesion. The following parameters were targeted:

Initial (fresh) viscosity not to exceed 3000 mPa-s (cP), measured at 25° C. Viscosity 24 hours after preparing adhesive composition not to exceed 3000 mPa-s (cP).

Resistance measured lengthwise of a 2 inch by 0.125 inch strip of adhesive printed on Avery Fasson 100 lb paper not to exceed 150 kΩ.

Tape peel test applied to copper foil surface adhered to conductive adhesive coated paper not to remove more than 0.5% of tape applied area.

Various conductive adhesive formulations were evaluated by first preparing admixtures of the components and stirring together until homogeneous. The order of addition is: water, ethylene acrylic acid (EAA), second polymer (if used), conductive carbon black (CCB), and Rheolate 212. Viscosity was measured either by a Brookfield viscometer or TA rheometer.

Lab scale printed samples were made on 2 inch wide strips 100 lb Avery Fasson paper using a Pamarco flexo hand proofer fitted with a 11.1 BCM anilox roll. The samples were oven dried for at least 20 min. in a 70° C. oven. One eighth inch (0.125 in.) wide strips were cut widthwise from the 2 inch wide sample print for measurement of resistance using a hand held Fluke multimeter.

Foil adhesion was assessed by taping a 2"×2" printed sample to a sheet of bond paper (which acts as a support for foil application and allows a small sample to be fed through the nip of the foiling system). Post foil application an approximately 2" long piece of 3M Scotch Magic transparent tape was applied to the foil surface with moderate finger pressure and then removed. The tape sample was applied to a piece of bond paper and is scanned at 1200 dpi using an Epson V750 Pro scanner to digitize the image (8 bit depth gray scale). The gray scale image was analyzed in Adobe Photoshop using the histogram function set at a bit value of 190. The percentage less than 190 was taken to represent the percent of the area holding copper foil removed by the tape. Testing

| Formula ID | init. visc. (mPa-s) (cP) <3000 | ~24 hr. visc. (mPa-s) (cP) <3000 | 2" × 0.125" Resist. (KΩ) <150 | tape test: % Cu removed <0.5% |
|---|---|---|---|---|
| Examples | | | | |
| 1 | 1380 | 1770 | 104 | 0.14 |
| 2 | 1990 | 2430 | 97.6 | 0.00 |
| Comp examples | | | | |
| 3 | 4880 | 5740 | 82.4 | 0.00 |
| 4 | 5390 | — | 119 | 1.12 |
| 5 | 2080 | — | 165 | 12.8 |
| 6 | 1580 | — | 605 | 0.33 |
| 7 | 2080 | — | 485 | 0.17 |

It was discovered that by combining two or more polymer dispersions in the conductive adhesive composition all of the desired performance requirement could be simultaneously met (see formulas 1-2).

In the base formulations (comparative examples 3-7), (single polymer dispersion), poly(ethylene-co-acrylic acid), 20% acrylic acid content by weight in the copolymer, acts as the adhesive for copper foil. Non-ionically dispersed carbon black (Aquablak 5909 from Solution Dispersions, Inc.) was employed as the conductive agent. Elementis Rheolate 212 is the viscosity control additive used to raise composition viscosity into a range suitable for flexographic printing systems.

The shortcomings of the base formulation was a rapid rise in viscosity over time due to an interaction between poly-ethylene-co-acrylic acid) (EAA) and conductive carbon black (CCB) when both are present in the formulation at sufficiently high concentrations. This can lead to difficulty handling and printing the ink and cleaning the press after use.

When the concentration of EAA or CCB or both are lowered to reduce the rate of viscosity increase other required properties are adversely affected—lowering EAA concentration alone results in degraded foil adhesion, lowering CCB alone lowers conductivity (raises resistance).

It was found that by adding a second polymer, i.e. replacing a portion of the EAA in the base formulation with a suitable polymer dispersion of a fundamentally different structure (e.g. styrene-butadiene co-polymer or aliphatic polyurethane), it was possible to satisfy all of the performance requirements for conductive foil transfer adhesive (i.e., low resistance and strong adhesion).

In some embodiments, the adhesive material 106, 1010, and/or 1018 may be applied onto the receiver substrate in a pattern. A majority of the water may be vaporized once the adhesive composition is on the receiver substrate. The receiver substrate onto which the adhesive composition is applied may be maintained at an elevated temperature from about 25° C. to about 200° C., to promote vaporization of the water. The receiver substrate may then be brought into contact with the layer of the conductive material 120, 1014, or 1028 carried by the carrier substrate 114, 1012, or 1026, respectively, as described above.

Figure 29:
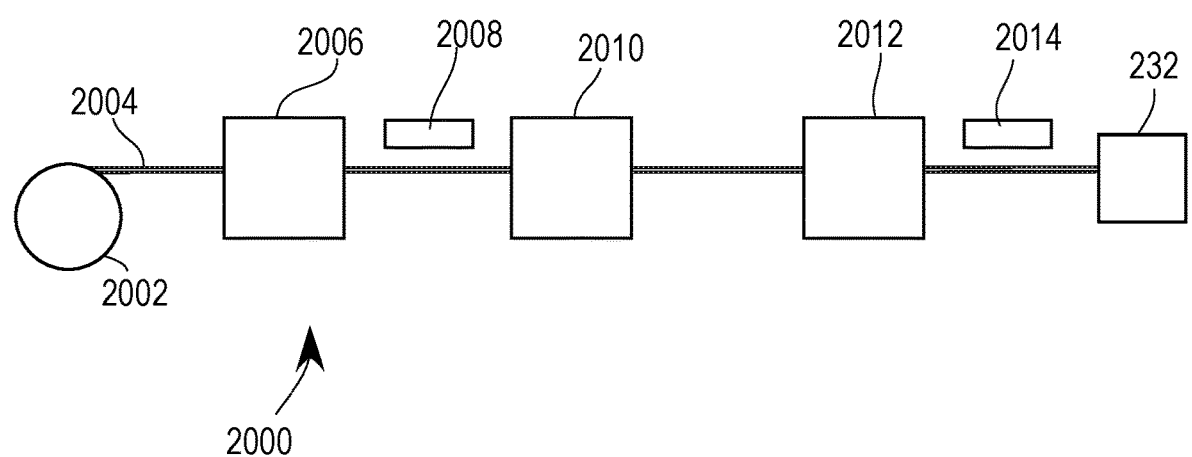
FIG. 29 is a schematic view of a manufacturing system to deposit layers of conductive traces and insulating material on a receiver substrate.

Referring to FIG. 29, in one embodiment of a manufacturing system 2000, a roll 2002 supplies a web 2004 of the receiver substrate 100. A first conductive layer deposition unit 2006 selectively deposits a conductive material to form a first circuit layer. In some embodiments, a first component deposition unit 2008 may deposit and affix electronic components onto the first circuit layer. An insulator layer deposition unit 2010 selectively deposits an insulating material on at least selected portions of the conductive material deposited by the first conductive layer deposition unit 2006. Thereafter, a second conductive layer deposition unit 2012 deposits a conductive material to form a second circuit layer, wherein at least a portion of the second circuit layer is deposited on top of the insulating material deposited by the insulator layer deposition unit 2010. In some embodiments, the conductive material deposited by the first conductive layer deposition unit 2006 is identical to the conductive material deposited by the second conductive deposition unit 2012. In other embodiments, the first conductive layer deposition unit 2006 and the second conductive layer deposition unit 2010 deposit different conductive materials.

In some embodiments, a second component deposition unit 2014 may deposit and affix electronic components onto one or both of the first circuit layer and the second circuit layer. Some embodiments of the manufacturing system 2000 may not include the first component unit 2008, and include the second component deposition unit 2014 to deposit and affix components after all of the circuit layers have been placed. In some embodiments, one or both of the first component deposition unit 2000 and the second component deposition unit 2014 may include an energy applicator to activate solder material deposited onto the receiver substrate 100 in order join pins of components with the conductive traces deposited onto the receiver substrate 100.

The first conductive layer deposition unit 2006, the insulating layer deposition unit 2010, and the second conductive layer deposition unit 2012 may be implemented by any of the material deposition units 200 or 250 described above. Further, it should be apparent that the paper or other substrate may be supplied as sheets instead of a web, and one or more the material deposition units 300 and/or 320 may be used with one another to provide the deposition units 2006, 2010, and/or 2012 of the system 2000. It will be apparent to one who has skill in the art that more may be used in a manufacturing system to form more layers on a substrate of conductive material separated by insulating material.

The transfer of a metal foil to form conductive traces of a circuit may be formed on a variety of substrates including paper, card stock, plastics, and the like. Because of the continuity of the metal foil and because the foil transfer is undertaken under pressure in a nip, the resulting circuit may be flatter and smoother than possible with other circuit printing processes.

INDUSTRIAL APPLICABILITY

In summary, a portion of a metal foil layer 118 is transferred from a carrier substrate 112 to a receiver substrate 100. An adhesive material 106 is applied in a pattern on the receiver substrate, the portion of the metal foil layer 118 is affixed to the adhesive material 106 as the receiver substrate 100 and carrier substrate 112 are transported through a nip. In some cases, pressure alone is sufficient to transfer the portion of the metal foil layer 118 to the receiver substrate 100. In other cases, a source of energy, for example heat or ultraviolet light, is sufficient to transfer the portion of the metal foil layer 118 to the receiver substrate 100. In still other, both pressure and the energy source are using in combination to facilitate such transfer.

Further, although the embodiments disclosed herein are described in connection with the transfer of a metal foil, it should be apparent that such embodiments may be adapted to transfer other materials from a first substrate to a second substrate.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar references in the context of describing the embodiments are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure. No language in the specification should be construed as indicating any element as essential to the practice of the disclosure.

Numerous modifications to the present disclosure will be apparent to those skilled in the art in view of the foregoing description. It should be understood that the illustrated embodiments are exemplary only, and should not be taken as limiting the scope of the disclosure.

What is claimed is:
1. A method of producing an electronic device including the steps of:
 applying an adhesive material in a first pattern on a surface of a first substrate, wherein the adhesive material is electrically conductive; and
 applying a metal on top of the adhesive material to secure the metal to the first substrate, wherein applying the metal comprises:
  bringing a second substrate having a metal foil disposed thereon proximate to the first substrate such that a portion of the metal foil contacts the adhesive material;
  activating the adhesive material using at least one of mechanical pressure and heat while the portion of the metal foil is in contact with the adhesive material;
  separating the first substrate and the second substrate, whereby the portion of the metal foil is transferred from the second substrate to the first substrate, wherein the applied heat of the activating step heats the adhesive material from approximately 60 degrees Celsius to approximately 160 degrees Celsius and wherein the applied pressure of the activating step is from about 10 psi to about 25 psi;

wherein the metal comprises a conductive trace of an electronic circuit, and wherein the viscosity of the adhesive material of the adhesive applying step is between about 1,000 and about 3,000 mPa-s.

2. The method of claim 1, wherein the adhesive material comprises a conductive carbon black and two or more polymers, and wherein the conductive carbon black is a non-ionic conductive carbon black dispersion, and wherein the metal is a copper.

3. The method of claim 1, wherein the adhesive material includes an ethylene acrylic acid copolymer having a molecular weight between about 5,000 and about 30,000 g/mol.

4. The method of claim 1, wherein the adhesive material includes an aliphatic polyurethane or a styrene butadiene.

5. The method of claim 1, further comprising the step of curing the adhesive material at a temperature greater of than or equal to about 70 degrees Celsius.

6. The method of claim 1, wherein the applying step is accomplished using a flexographic printing system.

7. The method of claim 1, wherein the adhesive material comprises between about 10 and about 40 wt % of conductive carbon black.

8. The method of claim 1, wherein the adhesive material comprises a conductive carbon black and two or more polymers, wherein one of the two or more polymers comprises ethylene acrylic acid copolymer.

9. The method of claim 1, wherein the metal is coupled to an electronic component.

10. The method of claim 1, wherein the adhesive material conducts electricity over localized disruptions of the electrical conductivity of the metal.

11. An adhesive composition comprising:
from about 2 to about 15 wt % of a first polymer;
from about 2 to about 15 wt % of a second polymer;
from about 3 to about 15 wt % of a conductive carbon black dispersion; and
a viscosity modifier,
wherein the first polymer is an ethylene acrylic acid copolymer, the second polymer is an aliphatic polyurethane or a styrene butadiene, and wherein the adhesive composition has a viscosity between about 1,000 mPa-s and about 3,000 mPa-s.

12. The adhesive composition of claim 11, wherein a ratio of the first polymer to the second polymer is between about 2:1 and about 1:2.

13. The adhesive composition of claim 11, wherein conductive carbon black comprises between about 10 and 40 wt % after the adhesive composition is dried.

14. The adhesive composition of claim 11, wherein a ratio of the first polymer and the second polymer to the conductive carbon black dispersion is between about 3:1 and about 1:1.

* * * * *